(12) United States Patent
Isono et al.

(10) Patent No.: US 11,570,383 B2
(45) Date of Patent: Jan. 31, 2023

(54) IMAGING DEVICE

(71) Applicant: Panasonic Intellectual Property Management Co., Ltd., Osaka (JP)

(72) Inventors: Shunsuke Isono, Osaka (JP); Tatsunori Momose, Osaka (JP); Ryota Sakaida, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 71 days.

(21) Appl. No.: 17/213,597

(22) Filed: Mar. 26, 2021

(65) Prior Publication Data

US 2021/0218912 A1 Jul. 15, 2021

Related U.S. Application Data

(63) Continuation of application No. PCT/JP2019/039468, filed on Oct. 7, 2019.

(30) Foreign Application Priority Data

Nov. 7, 2018 (JP) .............................. JP2018-210096
Sep. 10, 2019 (JP) .............................. JP2019-164328

(51) Int. Cl.
*H04N 5/341* (2011.01)
*H04N 5/355* (2011.01)
*H01L 27/146* (2006.01)

(52) U.S. Cl.
CPC ....... *H04N 5/341* (2013.01); *H01L 27/14603* (2013.01); *H01L 27/14627* (2013.01); *H04N 5/3559* (2013.01)

(58) Field of Classification Search
CPC .................. H04N 5/341; H04N 5/3559; H01L 27/14603; H01L 27/14627;
(Continued)

(56) References Cited

U.S. PATENT DOCUMENTS 8,492,864 B2 * 7/2013 Watanabe ......... H01L 27/14636
257/E31.127
2008/0042230 A1 * 2/2008 Miida ............... H01L 27/14623
438/96
(Continued)

FOREIGN PATENT DOCUMENTS

JP 2011-071483 4/2011
JP 2016-086231 5/2016
(Continued)

OTHER PUBLICATIONS

International Search Report of PCT application No. PCT/JP2019/039468 dated Dec. 24, 2019.

*Primary Examiner* — Lin Ye
*Assistant Examiner* — John H Morehead, III
(74) *Attorney, Agent, or Firm* — McDermott Will & Emery LLP

(57) ABSTRACT

An imaging device includes: pixels that are disposed in a row direction and a column direction and that include a first pixel and a second pixel adjacent to the first pixel along the row direction; a shield electrode located between the first pixel and the second pixel; a first shield via that extends from the shield electrode. The first pixel includes: a first photoelectric conversion layer that converts incident light to generate charge; and a first pixel electrode that collects the charge generated thereby. The second pixel includes: a second photoelectric conversion layer that converts incident light to generate charge; and a second pixel electrode that collects the charge generated thereby. The shield electrode is electrically isolated from the first pixel electrode and the second pixel electrode, and the first shield via is located between the first pixel electrode and the second pixel electrode in a plan view.

23 Claims, 14 Drawing Sheets

(58) Field of Classification Search
CPC .......... H01L 27/14612; H01L 27/1463; H01L 27/14636; H01L 27/14638; H01L 27/14667
See application file for complete search history.

(56) References Cited

U.S. PATENT DOCUMENTS

| | | | |
|---|---|---|---|
| 2008/0224136 A1* | 9/2008 | Wang | H01L 27/14687 257/E31.127 |
| 2011/0128400 A1* | 6/2011 | Wakano | H01L 27/14812 348/222.1 |
| 2011/0216231 A1* | 9/2011 | Fowler | H01L 27/146 257/E31.073 |
| 2011/0273602 A1* | 11/2011 | Takamiya | H04N 5/37457 348/E5.091 |
| 2013/0082267 A1* | 4/2013 | Aichi | H01L 27/1214 257/59 |
| 2014/0117486 A1* | 5/2014 | Doi | H01L 27/14665 257/448 |
| 2015/0195466 A1 | 7/2015 | Takase et al. | |
| 2016/0119563 A1 | 4/2016 | Yamada et al. | |
| 2016/0153837 A1* | 6/2016 | Kakimoto | G01J 5/0853 250/338.3 |
| 2016/0293654 A1 | 10/2016 | Tomekawa et al. | |
| 2018/0219046 A1* | 8/2018 | Yamaguchi | H01L 51/442 |
| 2018/0342558 A1 | 11/2018 | Hirata et al. | |
| 2020/0029038 A1 | 1/2020 | Uesugi et al. | |

FOREIGN PATENT DOCUMENTS

| | | |
|---|---|---|
| JP | 2016-127264 | 7/2016 |
| JP | 2016-197617 | 11/2016 |
| WO | 2013/001809 | 1/2013 |
| WO | 2014/208047 | 12/2014 |
| WO | 2016/104177 | 6/2016 |
| WO | 2018/190126 | 10/2018 |

* cited by examiner

IMAGING DEVICE

BACKGROUND

1. Technical Field

The present disclosure relates to imaging devices.

2. Description of the Related Art

Laminate-type imaging devices have been known. The laminate-type imaging devices each have a laminated structure including a semiconductor substrate and a photoelectric conversion layer.

Examples of such laminate-type imaging devices are disclosed in International Publication No. 2013/001809 and Japanese Unexamined Patent Application Publication No. 2016-127264. In the imaging devices in International Publication No. 2013/001809 and Japanese Unexamined Patent Application Publication No. 2016-127264, a photoelectric conversion layer is disposed between a counter electrode and pixel electrodes.

SUMMARY

In one general aspect, the techniques disclosed here feature an imaging device including: pixels that are disposed in a row direction and a column direction and that include a first pixel and a second pixel adjacent to the first pixel along the row direction; a shield electrode located between the first pixel and the second pixel; and a first shield via that extends from the shield electrode. The first pixel includes a first photoelectric conversion layer that converts incident light to generate charge, and a first pixel electrode that collects the charge generated by the first photoelectric conversion layer. The second pixel includes a second photoelectric conversion layer that converts incident light to generate charge, and a second pixel electrode that collects the charge generated by the second photoelectric conversion layer. The shield electrode is electrically isolated from the first pixel electrode and the second pixel electrode, and the first shield via is located between the first pixel electrode and the second pixel electrode in a plan view.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

Figure 1:
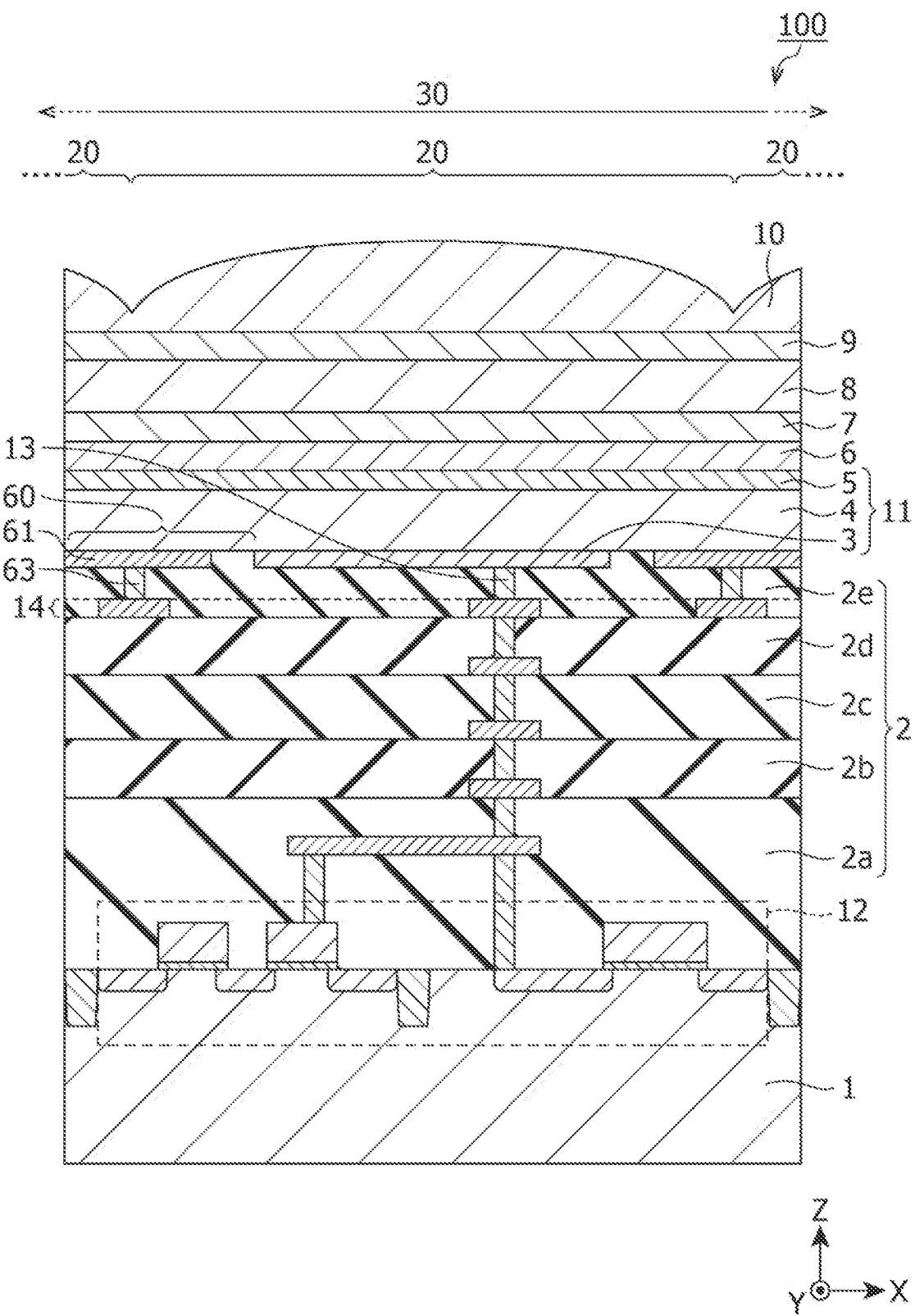
FIG. 1 is a view illustrating a cross-sectional structure of an imaging device according to an embodiment.

DETAILED DESCRIPTION (Overview of One Aspect According to Present Disclosure)

An imaging device according to a first aspect of the present disclosure includes:

pixels that are disposed in a row direction and a column direction and that include a first pixel and a second pixel adjacent to the first pixel along the row direction;

a shield electrode located between the first pixel and the second pixel; and a first shield via that extends from the shield electrode.

The first pixel includes a first photoelectric conversion layer that converts incident light to generate charge, and a first pixel electrode that collects the charge generated by the first photoelectric conversion layer.

The second pixel includes a second photoelectric conversion layer that converts incident light to generate charge, and a second pixel electrode that collects the charge generated by the second photoelectric conversion layer.

The shield electrode is electrically isolated from the first pixel electrode and the second pixel electrode, and the first shield via is located between the first pixel electrode and the second pixel electrode in a plan view.

The first aspect is suitable for acquiring images with high resolution.

In a second aspect of the present disclosure, for example, in the imaging device according to the first aspect, the pixels may include a third pixel adjacent to the first pixel along the column direction;

the third pixel may include a third photoelectric conversion layer that converts incident light to generate charge, and a third pixel electrode that collects the charge generated by the third photoelectric conversion layer; and the imaging device according to the first aspect may further include a second shield via that extends from the shield electrode and that is located between the first pixel electrode and the third pixel electrode in the plan view.

The second aspect is suitable for acquiring images with high resolution.

In a third aspect of the present disclosure, for example, in the imaging device according to the second aspect, the pixels may include a fourth pixel adjacent to the second pixel along the column direction;

the fourth pixel may include
   a fourth photoelectric conversion layer that converts incident light to generate charge, and
   a fourth pixel electrode that collects the charge generated by the fourth photoelectric conversion layer; and the imaging device according to the second aspect may further include
   a third shield via that extends from the shield electrode and that is located between the first pixel electrode and the fourth pixel electrode in the plan view.

The third aspect is suitable for acquiring images with high resolution.

In a fourth aspect of the present disclosure, for example, the imaging device according to the first aspect may further include
   a fourth shield via.

The shield electrode may surround the pixels in a shape of a lattice, and in the plan view, the fourth shield via may extend from a vertex of the lattice of the shield electrode.

The fourth aspect is suitable for acquiring images with high resolution.

In a fifth aspect of the present disclosure, for example, the imaging device according to one of the first to fourth aspects may further include:
   a first pixel via that extends from the first pixel electrode; and
   a second pixel via that extends from the second pixel electrode.

The first pixel via in the fifth aspect can electrically connect the first pixel electrode to another element. The second pixel via can electrically connect the second pixel electrode to another element.

In a sixth aspect of the present disclosure, for example, in the imaging device according to the fifth aspect,
   the first shield via may be located between the first pixel via and the second pixel via in the plan view.

The sixth aspect is suitable for acquiring images with high resolution.

In a seventh aspect of the present disclosure, for example, the imaging device according to one of the first to sixth aspects may further include
   a first wiring layer, and
   the first shield via may extend from the shield electrode to the first wiring layer.

The seventh aspect is suitable for acquiring images with high resolution.

In an eighth aspect of the present disclosure, for example, the imaging device according to one of the first to seventh aspects may further include
   an insulating portion located between the shield electrode and the first photoelectric conversion layer and located between the shield electrode and the second photoelectric conversion layer.

The eighth aspect is suitable for acquiring images with high resolution through use of the shield electrode, while suppressing a decline in the sensitivity of the imaging device, the decline being caused by the shield electrode.

In a ninth aspect of the present disclosure, for example, in the imaging device according to the eighth aspect,
   in the plan view, the insulating portion may include a portion that does not overlap the shield electrode.

The ninth aspect is suitable for acquiring images with high resolution.

In a tenth aspect of the present disclosure, for example, in the imaging device according to the ninth aspect,
   in the plan view, the insulating portion may be spaced from the first pixel electrode.

The tenth aspect is suitable for causing the first pixel electrode to capture signal charge to acquire images with high resolution.

In an 11th aspect of the present disclosure, for example, in the imaging device according to the eighth aspect,
   the insulating portion may have a film shape, and
   a thickness of the film shape may be greater than or equal to 10 nm.

The 11th aspect is suitable for suppressing a decline in the sensitivity of the imaging device, the decline being caused by the shield electrode.

An imaging device according to a 12th aspect of the present disclosure includes:
   pixels that are disposed in a row direction and a column direction and that include a first pixel and;
   a shield electrode that surrounds the pixels in a shape of a lattice; and
   a first shield via that extends from the shield electrode.

The first pixel includes
   a first photoelectric conversion layer that converts incident light to generate charge,
   a first pixel electrode that collects the charge generated by the first photoelectric conversion layer, and
   an insulating portion located between the shield electrode and the first photoelectric conversion layer.

The 12th aspect is suitable for acquiring images with high resolution through use of the shield electrode, while suppressing a decline in the sensitivity of the imaging device, the decline being caused by the shield electrode.

In a 13th aspect of the present disclosure, for example, in the imaging device according to the 12th aspect,
   in a plan view, the insulating portion may be spaced from the first pixel electrode, The 13th aspect is suitable for causing the first pixel electrode to capture signal charge to acquire images with high resolution.

In a 14th aspect of the present disclosure, for example, in the imaging device according to the 12th aspect,
   the insulating portion may have a film shape, and
   a thickness of the film shape may be greater than or equal to 10 nm.

The 14th aspect is suitable for suppressing a decline in the sensitivity of the imaging device, the decline being caused by the shield electrode.

In a 15th aspect of the present disclosure, for example, in the imaging device according to one of the first to 14th aspects,
   a surface of the first pixel electrode and a surface of the shield electrode may be in a same plane.

The imaging device in the 15th aspect can be easily manufactured.

In a 16th aspect of the present disclosure, for example, the imaging device according to the 12th aspect may further include
   an amplifying transistor that includes a gate electrode electrically connected to the first pixel electrode.

In a 17th aspect of the present disclosure, for example, in the imaging device according to the 12th aspect,
   in a plan view, the insulating portion may include a portion that does not overlap the shield electrode.

In an 18th aspect of the present disclosure, for example, the imaging device according to the first aspect may further include
a fifth shield via.

The shield electrode may surround the pixels in a shape of a lattice, and
the first shield via and the fifth shield via may extend from one side of the lattice of the shield electrode.

In a 19th aspect of the present disclosure, for example, in the imaging device according to the 12th aspect,
a lower surface of the insulating portion and a side surface of be insulating portion may form an angle that is less than 90 degrees.

In a 20th aspect of the present disclosure, for example, in the imaging device according to the 12th aspect,
the shield electrode may surround the first pixel electrode; and
the shield electrode may have four rectangular portions that surround the first pixel electrode and that are spaced from the first pixel electrode at distances that are equal to each other.

In a 21st aspect of the present disclosure, for example, in the imaging device according to the 12th aspect,
a spacing width between the first pixel electrode and the shield electrode may be greater than or equal to 0.1 µm and be less than or equal to 1 µm.

In a 22nd aspect of the present disclosure, for example, in the imaging device according to the 12th aspect,
in a plan view, an area of the first pixel electrode may be greater than an area of the shield electrode.

An imaging device according to a 23rd aspect of the present disclosure includes:
pixels that are disposed in a row direction and a column direction and that include a first pixel and a second pixel adjacent to the first pixel along the row direction; and
a shield electrode located between the first pixel and the second pixel.

The first pixel includes
a first photoelectric conversion layer that converts incident light to generate charge, and
a first pixel electrode that collects the charge generated by the photoelectric conversion layer, and
an insulating portion located between the shield electrode and the photoelectric conversion layer; and
a lower surface of the insulating portion and a side surface of the insulating portion form an angle that is less than 90 degrees.

In a 24th aspect of the present disclosure; for example, the imaging device according to one of the first to 23rd aspects may be a color image sensor.

In the color image sensor, the technology in the first aspect can contribute to suppressing color mixing.

An imaging device according to a 25th aspect of the present disclosure includes:
a photoelectric conversion layer that converts incident light to generate charge;
a first pixel electrode that collects the charge generated by the photoelectric conversion layer;
a shield electrode that is electrically isolated from the first pixel electrode; and
an insulating portion that is located between the shield electrode and the photoelectric conversion layer.

Herein, the terms "vias" may be used. Herein, via-holes and conductors therein are collectively referred to as "vias".

Herein, the terms "shield vias" and "pixel vias" are used. In the exemplary embodiments described below, the shield vias extend from shield electrodes. The pixel vias extend from pixel electrodes. Distinguish use of the terms "shield vias" and the "pixel vias" is made for convenience of description and are not intended to construe the features of the vias as limiting.

Herein, ordinals "first, second, third, . . . " may be used. When one element is denoted by any of the ordinals, it is not essential that the same type of element with a smaller ordinal exist. The numbers of the ordinals can be changed as appropriate.

The embodiments described below each represent a general or specific example. Numerical values, shapes, materials, constituent elements, the arrangement and the connection forms of constituent elements, steps, the order of steps, and so on described in the embodiments below are examples and are not intended to limit the present disclosure. Various aspects described herein can be combined together, as long as such combinations do not cause contradiction. Also, of the constituent elements in the embodiments below, constituent elements not set forth in the independent claims representing the broadest concept will be described as optional constituent elements. In the following description, constituent elements having substantially the same functions are denoted by the same reference numerals, and redundant descriptions may be omitted or be briefly given.

It should be noted that general or specific aspects may be implemented by an element, a device, an apparatus, a system, an integrated circuit, a method, or a computer program. It should also be noted that general or specific aspects may be implemented by any selective combination of an element, a device, an apparatus, a system, an integrated circuit, a method, and a computer program. Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

Various elements illustrated in the drawings are merely schematically illustrated for understanding of the present disclosure, and dimensional ratios, external appearances, and so on may differ from those of actual elements.

An imaging device according to one aspect of the present disclosure has, in an upper layer, a photoelectric conversion layer that converts light into electrical signals, that is, that performs photoelectric conversion, and has, in a lower layer, signal processing circuitry including silicon-based complementary metal-oxide semiconductor (CMOS) circuitry that takes out the electrical signals obtained by a photoelectric converter. Thus, in the imaging device according to one aspect of the present disclosure, since the photoelectric converter and the signal processing circuitry are laminated together, they can be independently designed.

EMBODIMENT

Figure 2:
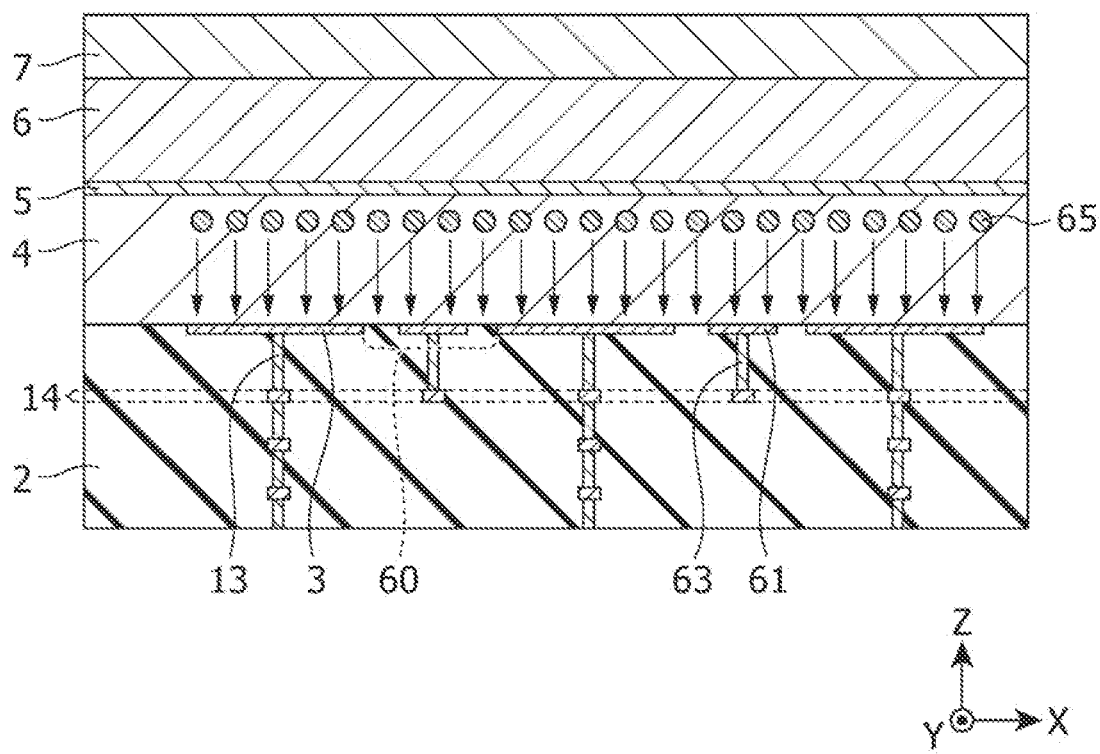
FIG. 2 is a cross-sectional structure of be imaging device according to the embodiment.

FIGS. 1 and 2 are sectional views of an imaging device 100 according to an embodiment.

The imaging device 100 includes a semiconductor substrate 1 and a pixel section 30. The pixel section 30 is provided on the semiconductor substrate 1.

The pixel section 30 includes a plurality of pixel electrodes 3, a counter electrode 5, and a photoelectric conversion layer 4. The photoelectric conversion layer 4 is disposed between the pixel electrodes 3 and the counter electrode 5. The photoelectric conversion layer 4 has a film shape.

The pixel section 30 includes detection circuits 12. The detection circuits 12 are partly provided in the semiconductor substrate 1. The detection circuits 12 detect potentials at the respective pixel electrodes 3.

The pixel section 30 includes an insulating layer 2. The insulating layer 2 is disposed between the photoelectric conversion layer 4 and the semiconductor substrate 1.

In the pixel section 30, the detection circuit 12 is configured so as to be provided across the interface between the semiconductor substrate 1 and the insulating layer 2. Specifically, the detection circuits 12 corresponding to the respective pixels 20 are configured.

Hereinafter, terms "X-axis", "Y-axis", and "Z-axis" may be used for convenience of description. These axes are orthogonal to each other. The positive side in Z-axis directions may be referred to as "upper" for convenience of description. A major surface at the positive side in the Z-axis directions may be referred to as an "upper surface", In this example, the upper surface is a surface that is closer to a light-incidence side. A lower surface is a surface that is farther from the light-incidence side. In this example, up-and-down directions are directions that are orthogonal to a surface of the semiconductor substrate 1.

The pixel electrodes 3 are formed at an upper surface of the insulating layer 2. Pixel vias 13 are connected to the pixel electrodes 3. The pixel vias 13 extend from the pixel electrodes 3 to a first wiring layer 14. Of a plurality of wiring layers, the first wiring layer 14 is the closest to the pixel electrodes 3. The pixel vias 13 electrically connect the corresponding pixel electrodes 3, the wiring layers, and the detection circuits 12 corresponding to the pixel electrodes 3.

Each of the pixels 20 includes a photoelectric converter 11. The photoelectric converter 11 includes the pixel electrode 3, the counter electrode 5, and the photoelectric conversion layer 4. As described above, the photoelectric conversion layer 4 is disposed between the pixel electrode 3 and the counter electrode 5.

The photoelectric conversion layer 4 converts incident light to generate charge.

The pixel electrode 3 collects the charge generated by the photoelectric conversion layer 4.

One example of material of the pixel electrode 3 is a metal compound, such as titanium nitride (TiN). Another example of the material of the pixel electrode 3 is metal, such as copper (Cu), tungsten (W), titanium (Ti), tantalum (Ta), or aluminum (Al). The material of the pixel electrode 3 may be a compound or alloy formed of at least two kinds of metal selected from those kinds of metal. The pixel electrode 3 may include a laminated structure formed of at least two kinds of metal selected from those kinds of metal. The laminated structure is, for example, a TiN/Ti structure. The TiN/Ti structure is a laminated structure in which a layer of titanium nitride and a layer of titanium are joined together.

In one specific example, the film thicknesses of the pixel electrodes 3 are equal to each other. The upper surface of each of the pixel electrodes 3 is planar.

As illustrated in the sectional view in FIG. 1, the pixel electrodes 3 are located between the photoelectric conversion layer 4 and the semiconductor substrate 1.

Figure 3:
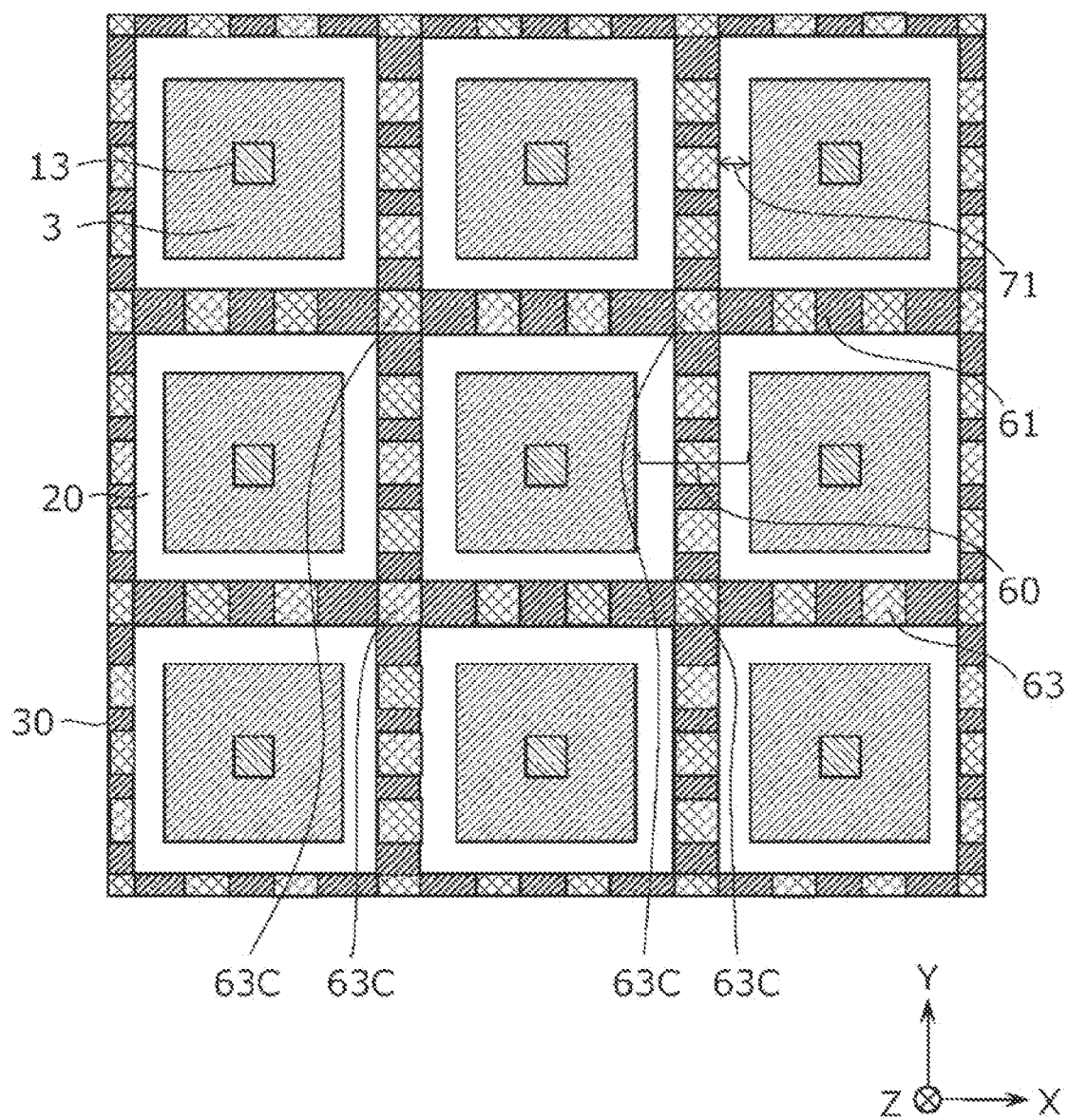
FIG. 3 is a view illustrating a planar structure of the imaging device according to the embodiment.

As illustrated in plan view in FIG. 3, the pixel electrodes 3 are arrayed in two-dimensional directions, specifically, the X-axis directions and the Y-axis directions. The pixel electrodes 3 are arranged at the upper surface of the insulating layer 2.

In one specific example, the pixel electrodes 3 are arranged in a matrix. The expression "elements are arranged in a matrix" as used herein means that the centers of the elements are located at respective intersections in a lattice. The pixel electrodes 3 have regular intervals therebetween.

The pixel electrodes 3 are arranged corresponding to the arrangement of the pixels 20. In one example, the pixels 20 are arranged in a matrix. The pixel electrodes 3 are arranged in a matrix so as to correspond to the arrangement of the plurality of pixels 20.

A reference is made to FIG. 1 again. As described above, in the imaging device 100, the detection circuits 12 corresponding to the respective pixels 20 are configured. Each detection circuit 12 detects signal charge collected by the corresponding pixel electrode 3 and outputs a signal voltage corresponding to the charge.

The detection circuit 12 includes, for example, a metal oxide semiconductor (MOS) circuit, a thin-film transistor (TFT) circuit, and so on. The detection circuit 12 includes, for example, an amplifying transistor having a gate electrically connected to the corresponding pixel electrode 3, and the amplifying transistor outputs a signal voltage corresponding to the amount of signal charge. The detection circuit 12 may be light-shielded by a light-shielding layer provided inside the insulating layer 2 or the like. The light-shielding layer is not illustrated in FIG. 1.

Each pixel via 13 electrically connects the pixel electrode 3 of the corresponding pixel 20, the wiring layer, and the detection circuit 12 corresponding to the pixel electrode 3.

One example of material of the pixel vias 13 is an electrically conductive material, such as copper (Cu), tungsten (W), or cobalt (Co). The pixel vias 13 are embedded in the insulating layer 2.

The insulating layer 2 is formed on the semiconductor substrate 1. The insulating layer 2 includes constituent layers 2a, 2b, 2c, 2d, and 2e.

The semiconductor substrate 1 is composed of, for example, silicon (Si). The constituent layers 2a, 2b, 2c, 2d, and 2e are composed of, for example, silicon dioxide ($SiO_2$) or silicon oxycarbide (SiOC).

Wiring layers are embedded in the constituent layers 2a, 2b, 2c, 2d and 2e. The wiring layers have wires. The wiring layer and the wiring layer are connected to each other through vias. Thus, although an insulator of the insulating layer 2 is provided between the wiring layers, the wiring layers are electrically connected to each other through vias. The number of constituent layers in the insulating layer 2 can be arbitrarily set and is not limited to the exemplary five constituent layers 2a, 2b, 2c, 2d and 2e illustrated in FIG. 1. The same applies to the number of wiring layers.

The pixel electrodes 3 are arranged in the constituent layer 2e. The photoelectric conversion layer 4 is laminated on the upper surfaces of the constituent layer 2e and the pixel electrodes 3. The counter electrode 5, a buffer layer 6, and a sealing layer 7 are laminated on the upper surface of the photoelectric conversion layer 4 in that order. A color filter 8 having a transmission wavelength bands corresponding to the pixels 20 is disposed on the upper surface of the sealing layer 7. A planarization layer 9 is disposed on the upper surface of the color filter 8. Microlenses 10 are disposed on the upper surface of the planarization layer 9. The constituent layers in the insulating layer 2 are interposed in a gap between the adjacent pixel electrode 3.

In tis example, the imaging device 100 is a color image sensor. However, the color filter 8 can also be omitted. That is, the imaging device 100 may be a monochrome image sensor.

The photoelectric conversion layer 4 is composed of a photoelectric conversion material that generates charge in accordance with the intensity of received light. The photoelectric conversion material is, for example, an organic semiconductor material and includes at least one of a p-type organic semiconductor and an n-type organic semiconductor. In one specific example, the film thickness of the photoelectric conversion layer 4 is uniform in the pixel section 30. In another specific example, the photoelectric conversion layer 4 has two or more portions whose film thicknesses are different from each other in the pixel section 30.

The counter electrode 5 opposes the pixel electrodes 3. Specifically, in the pixel section 30, the counter electrode 5 opposes the pixel electrodes 3 and shield electrodes 61 described below, with the photoelectric conversion layer 4 being interposed therebetween. The counter electrode 5 is disposed at the light-incidence side of the imaging device 100, viewed from the photoelectric conversion layer 4. The counter electrode 5 may have translucency in order to allow light to be incident on the photoelectric conversion layer 4. Material of the counter electrode 5 is, for example, a transparent conductive oxide material, such as indium tin oxide (ITO) or indium zinc oxide (IZO).

The expression "a first element opposes a second element with a third element being interposed therebetween" should not be construed as limiting to refer to only a structure in which the first element and the second element are in contact with the third element. For example, the expression "the counter electrode 5 opposes the pixel electrodes 3 and the shield electrodes 61 with the photoelectric conversion layer 4 being interposed therebetween" encompasses a structure in which an insulating portion 62, which is described below, is interposed between the shield electrodes 61 and the photoelectric conversion layer 4, and the interposition prevents contact between the shield electrodes 61 and the photoelectric conversion layer 4.

Next, a description will be given of an imaging mechanism.

Light that is incident on the imaging device 100 from above passes through the sealing layer 7, the buffer layer 6, and the counter electrode 5 and is incident on the photoelectric conversion layer 4. With an appropriate bias voltage being applied across the pixel electrode 3 and the counter electrode 5, the photoelectric conversion layer 4 photoelectrically converts the incident light to generate charge. The bias voltage is a potential difference between the counter electrode 5 and the pixel electrode 3.

The charge generated by the photoelectric conversion layer 4, as described above, is transferred from the pixel electrode 3 to an accumulation region in the corresponding detection circuit 12 through the pixel via 13 and is temporarily accumulated in the accumulation region. Owing to opening/closing operation of a transistor element or the like in the detection circuit 12, the charge is then output from the detection circuit 12 as a signal at an appropriate timing.

(Shield Electrode)

In the laminate-type imaging device 100 described above, the photoelectric conversion layer 4 is disposed between the pixel electrodes 3 and the counter electrode 5. As illustrated in FIG. 3, the shield electrodes 61 are disposed in a region 60 between the pixel electrode 3 and the pixel electrode 3. Specifically, the insulating layer 2 and the shield electrodes 61 are disposed in the region 60. The insulating layer 2 is not illustrated in FIG. 3. In the example illustrated in FIG. 3, the region 60 has the shape of a lattice in plan view. The plan view means, for example, observing in a direction orthogonal to the surface of the semiconductor substrate 1.

Suppose the shield electrodes 61 do not exist. In this case, the intensity of an electric field applied to a portion that is included in the photoelectric conversion layer 4 and that overlaps the region 60 in plan view is low, compared with a portion that is included in the photoelectric conversion layer 4 and that overlaps the pixel electrode 3. Thus, in the portion that is included in the photoelectric conversion layer 4 and that overlaps the region 60, the intensity of the electric field that the signal charge receives from the pixel electrode 3 is relatively low.

The signal charge can also exist in the aforementioned portion that overlaps the region 60. There is a possibility that the signal charge does not reach the pixel electrode 3 that the signal charge should reach and reaches the pixel electrode 3 adjacent to that pixel electrode 3. When the signal charge that reaches the adjacent pixel electrode 3 is detected as a pixel signal of the adjacent pixel, the resolution declines. The shield electrodes 61 can be used from the viewpoint of suppressing a decline in the resolution. When the imaging device 100 is a color image sensor, using the shield electrodes 61 makes it possible to suppress color mixing.

The shield electrodes will be described below with reference to the accompanying drawings.

As illustrated in the sectional view in FIG. 1, the shield electrodes 61 are disposed between the photoelectric conversion layer 4 and the semiconductor substrate 1. As illustrated in FIG. 3, the shield electrodes 61 are electrically isolated from the pixel electrodes 3.

In this example, the shield electrode 61 is disposed in the region 60 between the pixel electrode 3 and the pixel electrode 3. Since the shield electrode 61 is disposed, a voltage can be applied to a region between two pixel electrodes 3 that are adjacent to each other. Thus, signal charge 65 generated in the portion that is included in the photoelectric conversion layer 4 and that overlaps the region 60 in plan view is collected by the shield electrodes 61. This can suppress the signal charge 65 reaching the pixel electrode 3 that is adjacent to the pixel electrode 3 that the signal charge should reach. Thus, it is possible to suppress mixing of signal charge between the adjacent pixels. This provides images with high resolution. When the imaging device 100 is a color image sensor, it is possible to suppress mixing of colors between the adjacent pixels.

The material of the shield electrodes 61 is, for example, metal, such as copper (Cu), tungsten (W), titanium (Ti), tantalum (Ta), or aluminum (Al). The material of the shield electrodes 61 may be a compound or alloy formed of at least two kinds of metal selected from those kinds of metal. The shield electrodes 61 may include a laminated structure formed of at least two kinds of metal selected from those kinds of metal. The laminated structure is, for example, a TiN/Ti structure.

In one specific example, the film thicknesses of the shield electrodes 61 are substantially the same. The surface of each shield electrode 61, the surface being adjacent to the photoelectric conversion layer 4, is planar.

In the example illustrated in FIGS. 1 and 2, surfaces of the shield electrodes 61 and surface of the pixel electrodes 3 are in the same plane. Specifically, surfaces of the shield electrodes 61, the surfaces opposing the semiconductor substrate 1, and surfaces of the pixel electrodes 3, the surfaces opposing the semiconductor substrate 1, are in the same plane. An imaging device having such a configuration can be easily manufactured. However, the surfaces of the shield electrodes 61 and the surfaces of the pixel electrodes 3 do not necessarily have to be in the same plane. Specifically, the surfaces of the shield electrodes 61, the surfaces opposing the semiconductor substrate 1, and the surfaces of the pixel electrodes 3, the surfaces opposing the semiconductor substrate 1, do not necessarily have to be in the same plane.

The material of the shield electrodes 61 and the material of the pixel electrodes 3 may be the same. In this case, the shield electrodes 61 and the pixel electrodes 3 can be formed without requiring individual manufacturing processes. This allows the shield electrodes 61 and the pixel electrodes 3 to be formed in the same manufacturing process and with the same mask. Thus, it is not necessary to consider misalignment. The "misalignment" as used herein means that a relative positional relationship between the shield electrodes 61 and the pixel electrodes 3 deviates from an appropriate range.

A spacing width 71 between the pixel electrode 3 and the shield electrode 61 is, for example, greater than or equal to 0.1 µm and less than or equal to 1 µm.

(Insulating Portion Between Shield Electrodes 61 and Photoelectric Conversion Layer 4)

When the shield electrodes 61 are arranged as illustrated in FIGS. 1 and 2, part of the signal charge 65 generated in the photoelectric conversion layer 4 is collected by the shield electrodes 61. When the amount of signal charge that can be captured by the pixel electrodes 3 decreases owing to that charge collection, there are cases in which the sensitivity of the imaging device declines. From the viewpoint of suppressing a decline in the sensitivity of the imaging device, an insulating portion may be provided between the shield electrode 61 and the photoelectric conversion layer 4. An example of such a configuration in which an insulating portion is provided will be described below with reference to FIGS. 4A, 4B, 4C, 4D, 4E, 5A, 5B, and 6.

Figure 4A:
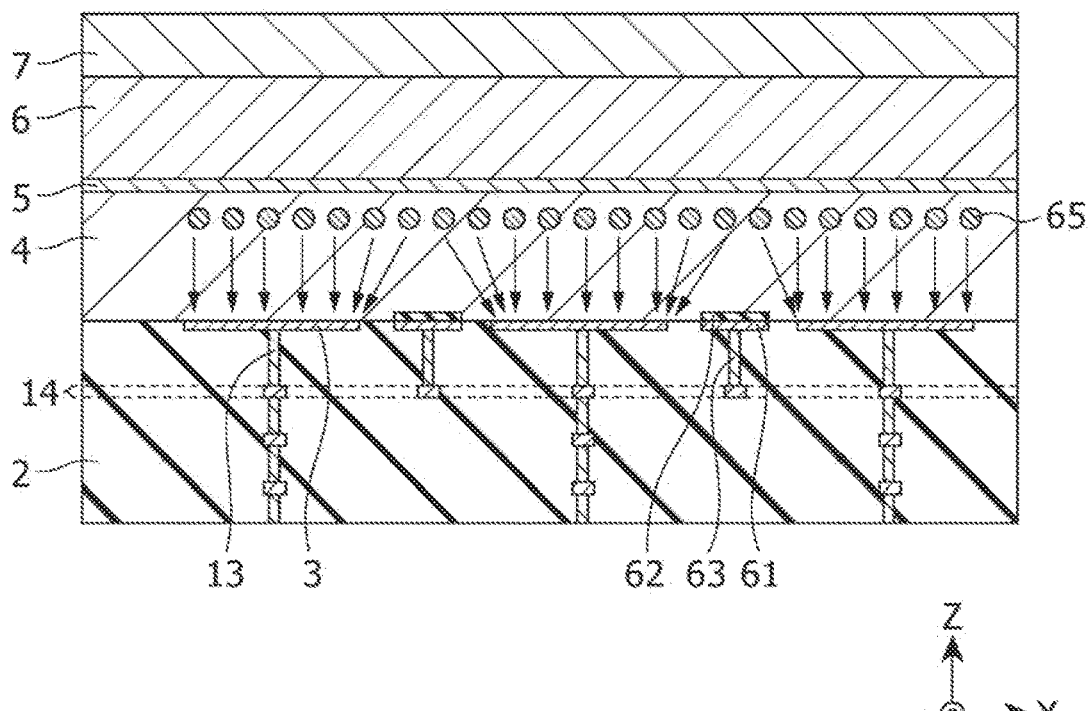
FIG. 4A is a view illustrating a cross-sectional structure of the imaging device according to the embodiment.
Figure 4B:
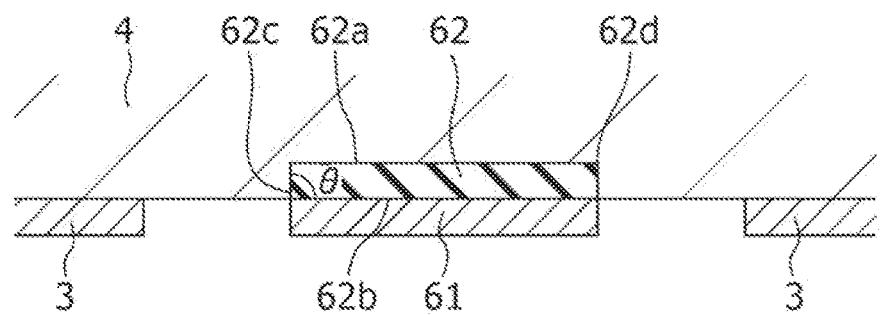
FIG. 4B is a partially enlarged view of FIG. 4A.

In the example in FIGS. 4A and 4B, an insulating portion 62 is provided between the shield electrode 61 and the photoelectric conversion layer 4. The insulating portion 62 is an insulator. Provision of such an insulating portion 62 makes it possible to suppress flow of signal charge into the shield electrode 61 to thereby suppress a decline in the sensitivity of the imaging device, while maintaining a state in which an electric field is applied across a region between two pixel electrodes 3 that are adjacent to each other and the counter electrode 5. Thus, this example is suitable for acquiring images with high resolution through use of the shield electrodes 61, while suppressing a decline in the sensitivity of the imaging device, the decline being caused by the shield electrodes 61.

In the example in FIGS. 4A and 4B, the insulating portion 62 covers the shield electrode 61. Specifically, the insulating portion 62 covers the entire surface of the shield electrode 61, the surface being adjacent to the photoelectric conversion layer 4.

In the example in FIGS. 4A and 4B, the insulating portion 62 is in contact with the shield electrode 61. Specifically, the insulating portion 62 is in contact with the entire surface of the shield electrode 61, the surface being adjacent to the photoelectric conversion layer 4. The insulating portion 62 prevents the shield electrode 61 and the photoelectric conversion layer 4 from contacting each other.

Figure 4C:
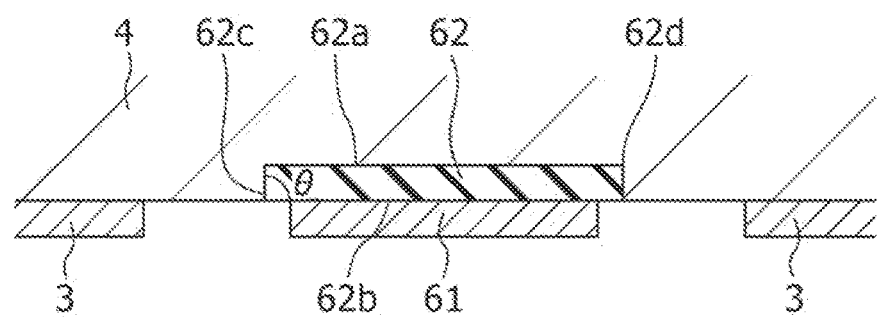
FIG. 4C is a view illustrating an insulating portion according to an example that is different from the example in FIG. 4B.

As illustrated in FIG. 4C, in plan view, the insulating portion 62 may include a portion that protrudes relative to the shield electrode 61 and that does not overlap the shield electrode 61 in plan view. With this arrangement, in plan view, a part or all of the contour of the insulating portion 62 can be placed outside the contour of the shield electrode 61. With this arrangement, it is possible to suppress obliquely upward electric fields that are applied from end portions of the shield electrode 61 toward the photoelectric conversion layer 4. This is advantageous, for example, from the viewpoint of ensuring insulation between the shield electrode 61 and the pixel electrode 3. Also, the protrusion of the insulating portion 62 relative to the shield electrode 61 in plan view is advantageous from the viewpoint of suppressing signal charge flowing along the sides of the insulating portion 62 and then into the shield electrode 61. Thus, the structure illustrated in FIG. 4C is suitable for acquiring images with high resolution.

The "protrusion of the insulating portion 62 relative to the shield electrode 61 in plan view" means that the insulating portion 62 includes a portion that is located outside the contour of the shield electrode 61 in plan view. The shield electrode 61 can also be said to include a portion that is located inside the contour of the insulating portion 62 in plan view. More specifically, the "protrusion of the insulating portion 62 relative to the shield electrode 61 in plan view" is a concept including not only a case in which the entire contour of the insulating portion 62 exists outside the contour of the shield electrode 61 in plan view but also a case in which only a part of the contour of the insulating portion 62 exists outside the contour of the shield electrode 61 in plan view. In plan view, the entire contour of the insulating portion 62 may exist outside the contour of the shield electrode 61 or only a part of the contour of the insulating portion 62 may exist outside the contour of the shield electrode 61.

In one specific example, in plan view, the insulating portion 62 is spaced from each pixel electrode 3. Such an arrangement makes it difficult for the insulating portion 62 to prevent signal charge capture performed by the pixel electrode 3. This is suitable for acquiring images with high resolution.

The insulating portion 62 may cover a portion of the pixel electrode 3.

In the example in FIGS. 4A and 4B, the pixel electrodes 3 and the photoelectric conversion layer 4 are electrically connected to each other. Specifically, the pixel electrodes 3 and the photoelectric conversion layer 4 are in contact with each other. However, a blocking layer may also be provided between the pixel electrodes 3 and the photoelectric conversion layer 4. The blocking layer transmits signal charge of charge pairs generated by photoelectric conversion in the photoelectric conversion layer 4, but prevents charge that is not signal charge from entering the pixel electrodes 3. This makes it possible to efficiently transport the signal charge to the pixel electrodes 3. The blocking layer exhibits a selective charge-transportation characteristic and is thus not an insulator.

Examples of the material of the insulating portion 62 include silicon dioxide ($SiO_2$), silicon oxycarbide (SiOC), silicon nitride (SiN), and silicon carbonitride (SiCN). Other examples of the material of the insulating portion 62 include a compound of copper (Cu), a compound of titanium (Ti), a compound of tantalum (Ta), and a compound of aluminum (Al). The insulating portion 62 may include a laminated structure formed of at least two kinds of material selected from those materials.

The material of the insulating portion 62 may be the same as the material of the insulating layer 2 or may be different from the material of the insulating layer 2.

Typically, the insulating portion 62 has a film shape. In this example, the thickness direction of the film shape matches a direction orthogonal to the surface of the semiconductor substrate 1.

The thickness of the film shape is, for example, 10 nm or more. Making the thickness of the film shape as large as such a degree makes it possible to suppress the signal charge propagating through the insulating portion 62 owing to a tunneling effect. Accordingly, it is possible to suppress the signal charge being collected by the shield electrode 61. Thus, making the thickness of the film shape to 10 nm or more is suitable for suppressing a decline in the sensitivity of the imaging device, the decline being caused by the shield electrode 61. The thickness of the film shape may be 20 nm or more.

The thickness of the film shape is, for example, less than or equal to 500 nm. Making the thickness of the film shape as small as such a degree facilitates that the signal charge is collected to the vicinity of the shield electrode 61 when a voltage is applied to the shield electrode 61. When signal charge generated between the pixel electrodes 3 is collected to the vicinity of the shield electrode 61, it is possible to suppress signal charge being collected by a portion other than a desired one of the pixel electrodes 3. Thus, making the thickness of the film shape less than or equal to 500 nm is suitable for acquiring images with high resolution through use of the shield electrode 61. The thickness of the film shape may be less than or equal to 300 nm.

When the thickness of the film shape is adjusted to be in an appropriate range, signal charge generated between the pixel electrodes 3 can be collected to the vicinity of the shield electrode 61, while the signal charge collected by the shield electrode 61 is reduced to a virtually negligible level. Thus, it is easy to suppress the signal charge being collected by a portion other than a desired one of the pixel electrodes 3. Thus, images with high resolution can be easily acquired while suppressing a decline in the sensitivity of the imaging device, the decline being caused by the shield electrode 61.

The thickness of the film shape can be determined by a known scheme. The thickness of the film shape can be determined, for example, in the following manner. First, an electron microscope image of a section of the film shape is acquired. Next, the image is used to measure the thicknesses of a plurality of arbitrary measurement points (e.g., five points) of the film shape. The average value of the thicknesses of the measurement points is used as the thickness of the film shape.

When the above-described exemplary determination scheme is applied to an example described below and illustrated in FIGS. 5A and 5B, portions of side surfaces 62c are excluded from the measurement points, and the measurement points are set on portions of an upper surface 62a.

A method for forming the insulating portion 62 is not particularly limiting.

In one example, the insulating portion 62 is formed in the following manner. A layer of the material of the insulating portion 62 is formed on the shield electrode 61 (typically, the entire upper surface of the shield electrode 61). Next, parts of the layer of the material are removed. As a result, the insulating portion 62 is obtained. Such a process also makes it possible to obtain an insulating portion 62 having a film shape.

The layer of the material of the insulating portion 62 can be formed by, for example, chemical vapor deposition (CVD). The parts of the layer of the material of the insulating portion 62 can be removed by, for example, lithography, etching, or the like.

Figure 4D:
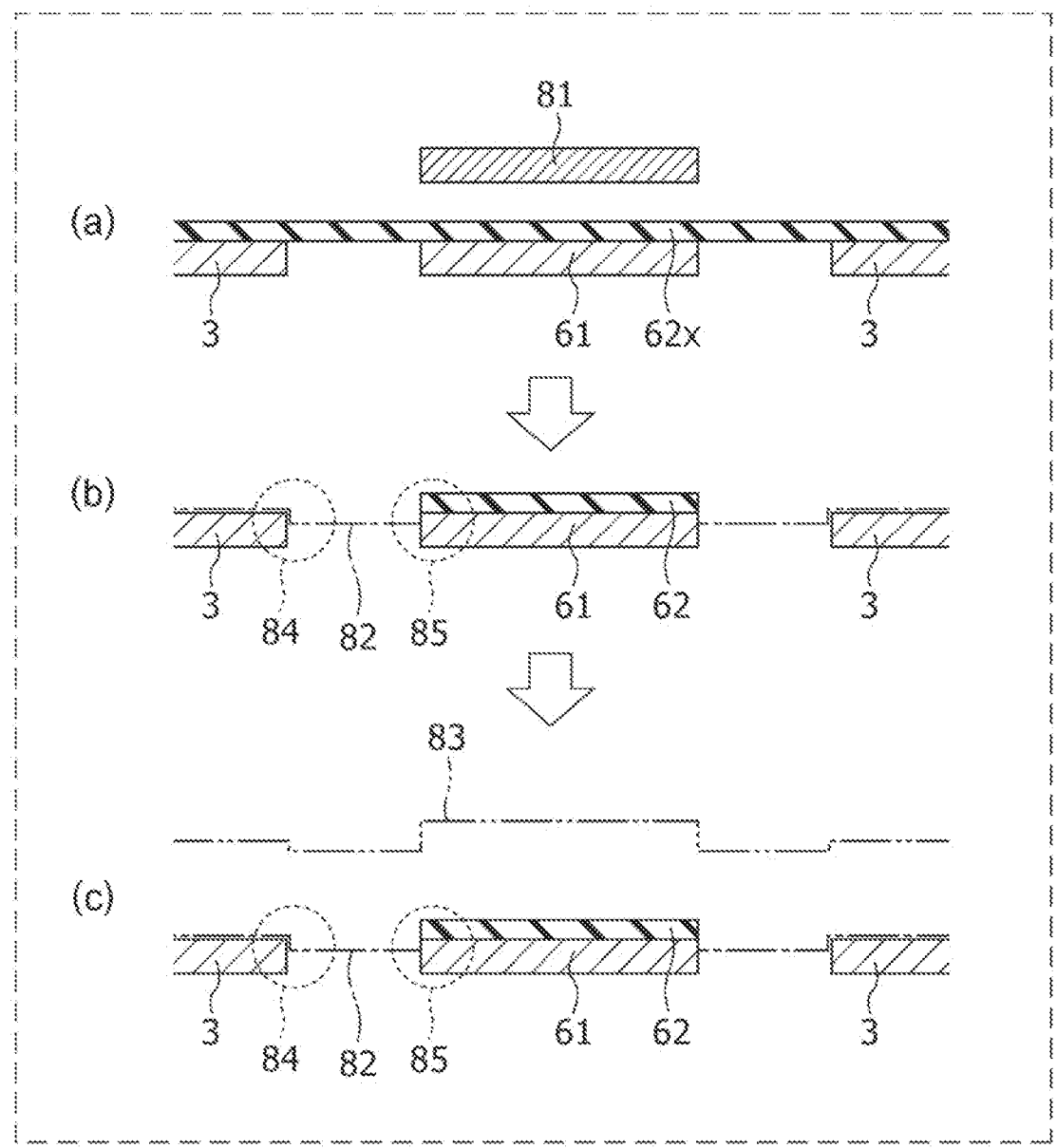
FIG. 4D is a schematic view illustrating a method for creating an insulating layer and a photoelectric conversion layer.
Figure 4E:
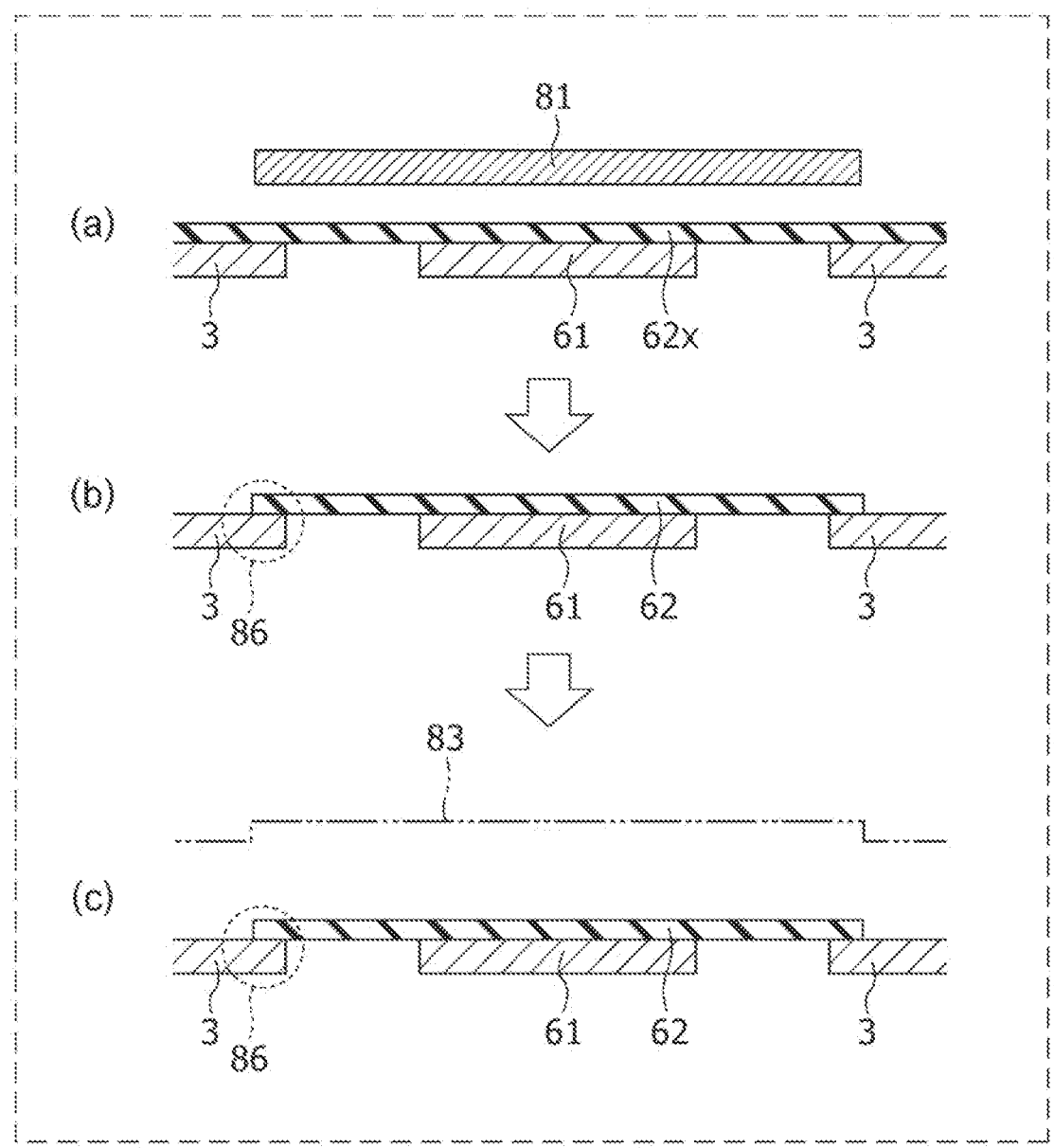
FIG. 4E is a schematic view illustrating a method for creating the insulating layer and the photoelectric conversion layer.

In plan view, the insulating portion 62 may cover the entire upper surfaces of the shield electrodes 61, the entire upper surface of the insulating layer 2 between the pixel electrodes 3 and the shield electrodes 61, and parts of the pixel electrodes 3. This allows the positions of level differences formed at the end portions of the insulating portion 62 to be placed on the pixel electrodes 3. An advantage obtained by placing the positions of the level differences on the pixel electrodes 3 will be described with reference to FIGS. 4D and 4E. FIGS. 4D and 4E are schematic views illustrating a method for fabricating the insulating layer 2 and the photoelectric conversion layer 4.

In part (a) in FIG. 4D and in part (a) in FIG. 4E, the pixel electrodes 3 and the shield electrode 61 are covered by a layer 62x of the material of the insulating portion 62. The layer 62x is partly covered by a mask 81. Parts of the layer 62x which are not covered by the mask 81 are removed by etching.

The insulating layer 2 is not illustrated in part (a) in FIG. 4D and in part (a) in FIG. 4E. In the description of FIGS. 4D and 4E, the insulating layer 2 is assumed to exist at a position between each pixel electrode 3 and the shield electrode 61. Also, in the description of FIGS. 4D and 4E, the upper surfaces of the insulating layer 2, which is located at the above-described position, are assumed to be flush with the upper surfaces of the pixel electrodes 3 and the upper surface of the shield electrode 61, before the etching is performed.

In part (a) in FIG. 4D, the mask 81 covers the entire upper surface of the shield electrode 61. However, the mask 81 does not cover the upper surface of the insulating layer 2 between each pixel electrodes 3 and the shield electrode 61. The mask 81 also does not cover the upper surfaces of the pixel electrodes 3. Meanwhile, in part (a) in FIG. 4E, the mask 81 covers the entire upper surface of the shield electrode 61 and the entire upper surface of the insulating layer 2 between each pixel electrode 3 and the shield electrode 61. In part (a) in FIG. 4E, the mask 81 further partly covers the upper surfaces of the pixel electrodes 3.

Performing etching using the mask 81 in part (a) in FIG. 4D provides the insulating portion 62 that covers only the entire upper surface of the shield electrode 61. On the other hand, performing etching using the mask 81 in part (a) in FIG. 4E provides the insulating portion 62 that covers the entire upper surface of the shield electrode 61, the entire upper surface of the insulating layer 2 between each pixel electrode 3 and the shield electrode 61, and parts of the upper surfaces of the pixel electrodes 3.

Part (b) in FIG. 4D and part (b) in FIG. 4E each illustrate a state in which parts of the layer 62x which are not covered by the mask 81 are removed by etching. As a result of the removal, the layer 62x is formed into the insulating portion 62.

In practice, it is difficult to scrape only the layer 62x by etching. When the mask 81 is placed as in part (a) in FIG. 4D, the pixel electrodes 3 and the insulating layer 2 that are not covered by the mask 81 are also scraped to some extent. The pixel electrodes 3 and the insulating layer 2 differ in the etching rate and are thus different in the degree of being scraped. Thus, as illustrated in a region surrounded by a dotted line 84 in part (b) in FIG. 4D, a difference occurs between the height of the upper surface of each pixel electrode 3 and the height of the upper surface of the insulating layer 2. Also, as illustrated in a region surrounded by a dotted line 85, a difference occurs between the height of the upper surface of the insulating portion 62 and the height of the upper surface of the insulating layer 2. The difference in the height of the upper surface occurs at the boundary between a portion covered by the mask 81 and a portion not covered thereby. Dashed-dotted lines 82 in part (b) in FIG. 4D represents the positions of the upper surfaces of the pixel electrodes 3 and the insulating layer 2.

The same also applies to a case in which the mask 81 covers the entire upper surface of the shield electrode 61 and partly covers the upper surface of the insulating layer 2 between each pixel electrode 3 and the shield electrode 61. In this case, the difference in the etching rate causes a difference between the height of the upper surface of each pixel electrodes 3 and the height of the upper surface of the insulating layer 2. A difference in the height of the upper surface occurs between a portion where the insulating portion 62 is located on the insulating layer 2 and a portion where the insulating portion 62 is not located on the insulating layer 2. The difference in the height of the upper surface occurs at the boundary between a portion where the insulating layer 62x on the insulating layer 2 is covered by the mask 81 and a portion where the insulating layer 62x on the insulating layer 2 is not covered by the mask 81.

In contrast, when the mask 81 is placed as in part (a) in FIG. 4E, a difference in the height of the upper surface occurs on each pixel electrode 3, as illustrated in a dotted line 86 in part (b) in FIG. 4E. This difference occurs at the boundary between a portion covered by the mask 81 and a portion not covered thereby. However, since the insulating layer 2 is entirely covered by the insulating portion 62, no difference in the height of the upper surface occurs on the insulating layer 2. Thus, the number of level differences at the upper surfaces formed by etching using the mask 81 can be reduced compared with the case in FIG. 4D.

Part (c) in FIG. 4D and part (c) in FIG. 4E each illustrate a state in which the photoelectric conversion layer 4 is formed on the upper surfaces formed by etching. When the photoelectric conversion layer 4 is formed on the upper surfaces formed by etching, the shape of the upper surfaces is also reflected in the shape of the upper surface of the photoelectric conversion layer 4. Chain double-dashed lines 83 in part (c) in FIG. 4D and part (c) in FIG. 4E each represent the position of the upper surface of the photoelectric conversion layer 4.

As can be understood from the above description, the structure in FIG. 4E is advantageous from the viewpoint of planarizing the shape of the photoelectric conversion layer 4, compared with the structure in FIG. 4D. Thus, the configuration in which the insulating portion 62 covers the entire upper surface of the shield electrode 61, the entire upper surface of the insulating layer 2 between each pixel electrode 3 and the shield electrode 61, and parts of the upper surface of each pixel electrode 3 can be said to be advantageous from the viewpoint of planarizing the photoelectric conversion layer 4.

In the specific examples illustrated in FIGS. 4A, 43, and 4C, the insulating portion 62 has a film shape. As illustrated in FIGS. 4B and 4C, each film shape has the upper surface 62a, a lower surface 62b, and the side surfaces 62c. The side surfaces 62c extend from the lower surface 62b to the upper surface 62a. The upper surface 62a and the side surfaces 62c form corners 62d. The lower surface 62b and each side surface 62c make an angle θ. The angle θ is relatively large. Specifically, the angle θ is about 90°, Thus, each corner 62d is acute.

Figure 5A:
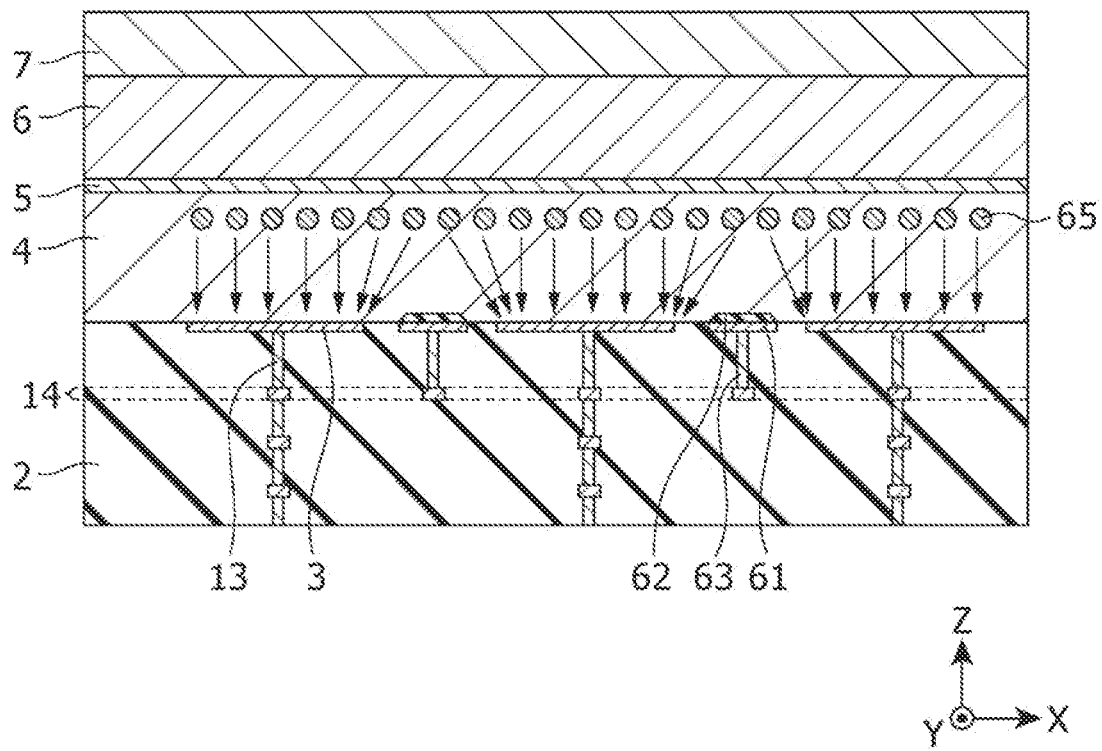
FIG. 5A is a view illustrating a cross-sectional structure of the imaging device according to the embodiment.
Figure 5B:
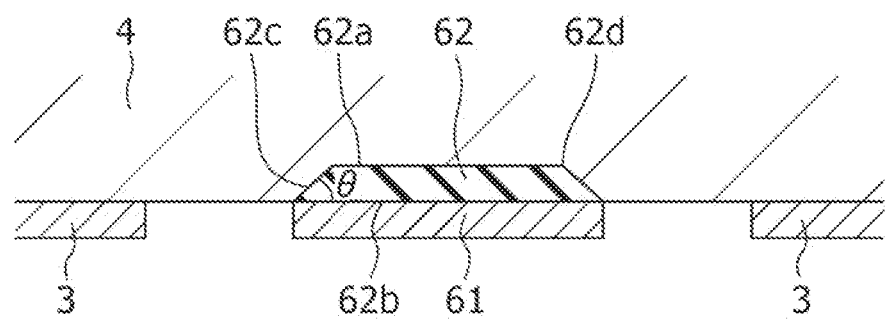
FIG. 5B is a partially enlarged view of FIG. 5A.

In another specific example illustrated in FIGS. 5A and 5B, the insulating portion 62 also has a film shape. In the specific example in FIGS. 5A and 5B, the angle θ is small, compared with the specific example illustrated in FIGS. 4A, 4B, and 4C. This reduces the acuteness of the corners 62d and makes it difficult for cracks to occur at the corners 62d during formation of the photoelectric conversion layer 4. This makes it difficult for the photoelectric conversion layer 4 to deteriorate at portions that are in contact with the insulating portion 62.

A reduction in the angle θ or a reduction in the acuteness of the corners 62d can be realized by, for example, a reverse sputtering effect by which the corners of the insulating portion 62 are scraped by ions in plasma, the corners being rounded during insulating-portion planarization using chemical-mechanical polishing (CMP), or the like.

Figure 6:
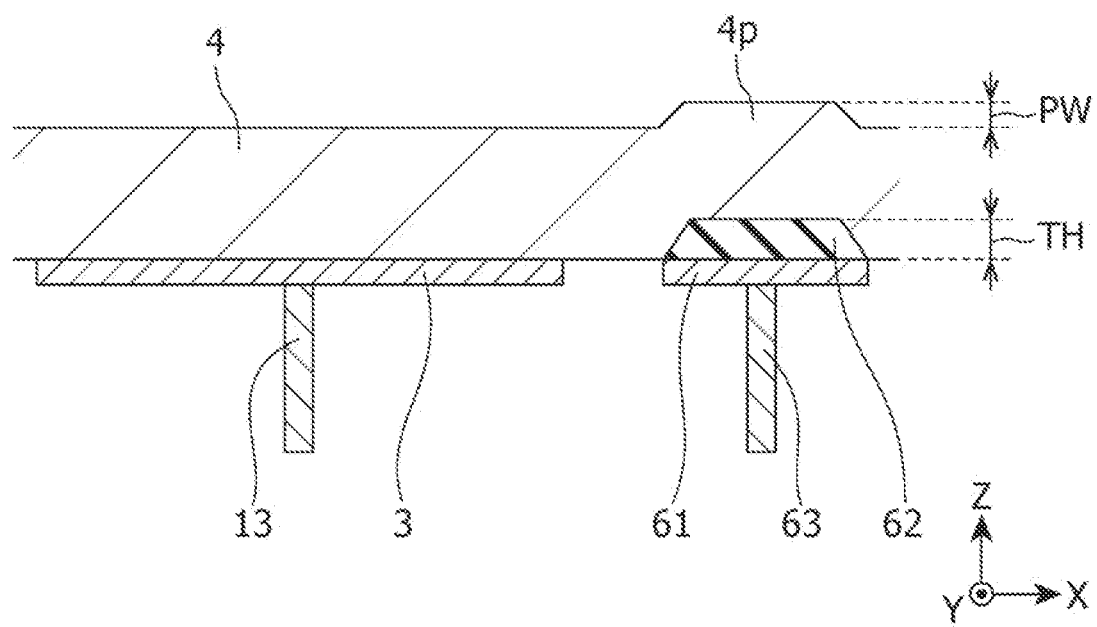
FIG. 6 is a view illustrating a protrusion portion of the photoelectric conversion layer.

In practice, a protrusion portion 4p can be formed at a position that is included in the photoelectric conversion layer 4 and that overlaps the insulating portion 62 in plan view, as illustrated in FIG. 6. In the photoelectric conversion layer 4, the protrusion portion 4p protrudes in the thickness direction of the film shape of the insulating portion 62, compared with portions around the protrusion portion 4p.

A protrusion width PW of the protrusion portion 4p can be the same as the thickness TH of the film shape of the insulating portion 62. However, as illustrated in FIG. 6, the protrusion width PW can be made less than the thickness TH. In other words, the thickness of the portion that is included in the photoelectric conversion layer 4 and that overlaps the insulating portion 62 in plan view can be reduced compared with the thicknesses of portions around the overlapping portion. For example, performing thermal processing on the photoelectric conversion layer 4 can reduce the protrusion width PW. The expression "the protrusion width PW is less than the thickness TH" is a concept including a case in which the protrusion width PW is zero.

As can be understood from the above description, it is possible to realize the photoelectric conversion layer 4 in which the protrusion width PW of the protrusion portion 4p is small or the protrusion portion 4p does not exist, while providing the insulating portion 62. When the upper surface of the photoelectric conversion layer 4 has high flatness, layers above the photoelectric conversion layer 4 can be easily fabricated.

In the example illustrated in FIG. 6, the thickness of a portion that is included in the photoelectric conversion layer 4 and that overlaps the pixel electrode 3 in plan view is greater than the thickness of a portion that is included in the photoelectric conversion layer 4 and that overlaps the shield electrode 61 in plan view. This is suitable for promoting photoelectric conversion at the former portion to cause the pixel electrode 3 to collect a larger amount of signal charge and for suppressing photoelectric conversion at the latter portion to suppress signal charge capture performed by the shield electrode 61.

The protrusion portion 4p in the photoelectric conversion layer 4 can also be formed when the insulating portion 62 has the structure illustrated in FIG. 4B and can also be formed when the insulating portion 62 has the structure illustrated in FIG. 4C. In those cases, PW=TH or PW<TH can also be satisfied. In those cases, it is also possible to realize the photoelectric conversion layer 4 in which the protrusion portion 4p does not exist. In those cases, the thickness of the portion that is included in the photoelectric conversion layer 4 and that overlaps the pixel electrode 3 in plan view can also be made greater than the thickness of the portion that is included in the photoelectric conversion layer 4 and that overlaps the shield electrode 61 in plan view.

Figure 7:
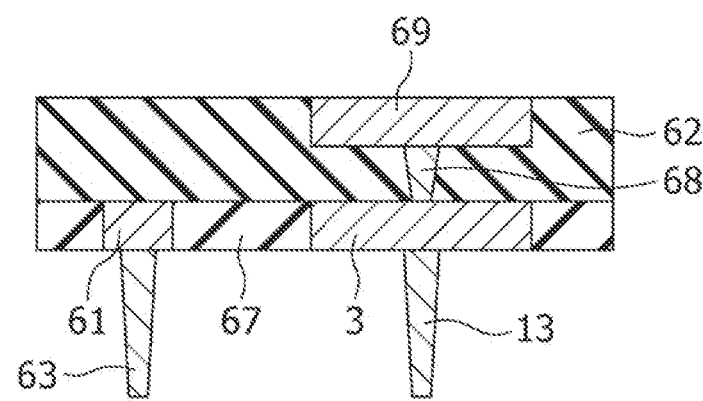
FIG. 7 is a view illustrating a cross-sectional structure of the imaging device according to the embodiment.

A specific example illustrated in FIG. 7 can also be used. In the specific example in FIG. 7, the insulating portion 62 also has a film shape. In this specific example, the pixel via 13, the pixel electrode 3, a via 68, and a pixel electrode 69 are sequentially connected from the semiconductor substrate 1 toward the photoelectric conversion layer 4. Thus, these elements are electrically connected. Signal charge that reaches the pixel electrode 69 flows through the via 68, the pixel electrode 3, and the pixel via 13 in that order.

In the specific example illustrated in FIG. 7, the insulating portion 62 surrounds the pixel electrode 69 in plan view. The upper surface of the insulating portion 62 and the upper surface of the pixel electrode 69 are flush with each other. The insulating portion 62 is also interposed between the pixel electrode 3 and the pixel electrode 69.

In the specific example illustrated in FIG. 7, the upper surface of the shield electrode 61 is covered by the insulating portion 62. The upper surface of the pixel electrode 3 is also covered by the insulating portion 62.

Provision of the via 68 and the pixel electrode 69, as in the specific example in FIG. 7, is advantageous from the viewpoint of providing the insulating portion 62 between the shield electrode 61 and the photoelectric conversion layer 4 while planarizing the lower surface of the photoelectric conversion layer 4. Thus, this configuration is advantageous from the viewpoint of suppressing occurrence of cracks in the photoelectric conversion layer 4. In particular, when the insulating portion 62 is thick, a large level difference that stems from the insulating portion 62 can be formed on the insulating portion 62 or the pixel electrode 69. In this case, since the photoelectric conversion layer 4 is formed on the non-planar surface, cracks are more likely to occur in the photoelectric conversion layer 4. Accordingly, in such a case, the crack suppression effect can be obtained using the configuration in FIG. 7. In the specific example in FIG. 7, the thickness of the film shape of the insulating portion 62 refers to the thickness of a portion that is included in the insulating portion 62 and that overlaps the shield electrode 61 in plan view. The above-described measurement points can be set in the overlapping portion.

In the example illustrated in FIG. 7, an insulator 67 is provided between the pixel electrode 3 and the shield electrode 61. The material of the insulator 67 and the material of the insulating portion 62 may be the same or may be different from each other. The insulator 67 can be the insulator of the insulating layer 2. Although not illustrated in FIGS. 4B, 4C, and 5B, the insulating layer 2, which is the insulator, is located between the pixel electrode 3 and the shield electrode 61.

(Shield Structure Using Vias Connected to Shield Electrode 61)

In the laminate-type imaging device 100, charge accumulation regions are provided independently from the photoelectric conversion layer 4. Each accumulation region is provided in a portion that is included in the detection circuit 12 and that is located in the semiconductor substrate 1. Charge generated by the photoelectric conversion layer 4 is transported from each pixel electrode 3 to the corresponding accumulation region through the pixel via 13.

In the laminate-type imaging device 100, a parasitic capacitance may occur between the pixel via 13 connected to one certain pixel electrode 3 and the pixel via 13 connected to the pixel electrode 3 that is adjacent to the certain pixel electrode 3. This parasitic capacitance can cause crosstalk between the pixels.

Connecting a via to the shield electrodes 61 to cause the via to provide shielding between the pixel vias 13 is conceivable in order to suppress the crosstalk caused by the parasitic capacitance. Such an approach can reduce parasitic capacitance between the pixel vias 13, thus making it possible to suppress crosstalk that stems from the parasitic capacitance.

As described above, the imaging device 100 includes a plurality of wiring layers. The wiring layers are arranged between the shield electrode and the semiconductor substrate 1. The wiring layers are provided at positions that are different from each other in directions orthogonal to the surface of the semiconductor substrate 1. Of the wiring layers, the first wiring layer 14 is the layer closest to the pixel electrodes 3. Wires that can function as shields for suppressing crosstalk are, in many cases, disposed in a region located more adjacent to the semiconductor substrate 1 than to the first wiring layer 14, compared with regions located more adjacent to the pixel electrodes 3 than to the first wiring layer 14. Hence, a shielding effect due to the vias connected to the shield electrode 61 is more likely to appear in regions more adjacent to the pixel electrodes 3 than to the first wiring layer 14. Also, the shielding effect due to the vias connected to the shield electrode 61 is more likely to appear when the gap between the pixel electrodes 3 and the first wiring layer 14 is large.

In one example, the imaging device 100 is a color image sensor. In one example of the color image sensor, pixels corresponding to R, G, and B are disposed adjacent to each other. That is, pixels corresponding to different colors are disposed adjacent to each other. Thus, when crosstalk between the pixels occurs, color mixing occurs. Applying the shield structure to the color image sensor suppresses crosstalk and suppresses an image-quality reduction due to color mixing.

The following description will be given of a technology utilizing the vias connected to the shield electrode 61. Hereinafter, the vias that extend from the shield electrode 61 may be referred to as "shield vias".

In the present embodiment, the shield vias 63, 63C are connected to the shield electrode 61, as can been seen from FIGS. 1 to 4A and 5A, 6, and 7. The shield vias 63, 63C extend from the shield electrode 61 toward the semiconductor substrate 1. Specifically, the shield vias 63, 63C extend from the shield electrode 61 to the first wiring layer 14.

Vias electrically connected to the shield electrode 61 may be provided more adjacent to the semiconductor substrate 1 than to the first wiring layer 14.

In the example illustrated in FIG. 3, in plan view, each pixel electrode 3 is surrounded by a frame-shaped portion included in the shield electrode 61. The shield vias 63C connected to the shield electrode 61 are arranged at four corners of each frame-shaped portion. In addition, the shield vias 63 are also arranged between the four corners and the four corners. In FIG. 3, the shield vias 63C located at the four corners of the frame-shaped portion that surrounds the pixel electrode 3 at the center in FIG. 3 is denoted by reference character 63C.

The number of shield vias 63, 63C may be larger than that in the example illustrated in FIG. 3. The crosstalk reduction effect increases, as the number of shield vias 63, 63C that surround each pixel electrode 3 in plan view increases. A larger number of shield vias 63, 63C may be provided so that the adjacent shield vias 63, 63C are in contact with each other. A collection of the shield vias 63, 63C provided as described above can also be referred to as a "line via".

As described above, connecting the shield vias 63, 63C to the shield electrode 61 and extending the shield vias 63, 63C toward the semiconductor substrate 1 makes it possible to suppress crosstalk between the pixels 20.

When the imaging device 100 is a color image sensor, suppressing crosstalk in the manner described above makes it possible to suppress color mixing.

The material of the shield vias 63, 63C is, for example, electrically conductive material, such as copper (Cu), tungsten (W), or cobalt (Co).

The shield vias 63, 63C are formed in the insulating layer 2 through embedment therein.

The shield vias 63, 63C may be formed in a manufacturing process that is the same as that for the pixel vias 13.

The shield structure using the shield vias connected to the shield electrode 61 may be provided without providing the insulating portion 62 between the shield electrode 61 and the photoelectric conversion layer 4.

Shielding using the shield vias will be further described below with reference to FIG. 8.

The shield vias may be described below with ordinals given thereto. In FIG. 8, the position of a first shield via, which is one shield via 63, is denoted by point P1. The position of a second shield via, which is one shield via 63, is denoted by point P2. The position of a third shield via, which is one shield via 63, is denoted by point P3. The position of a fourth shield via, which is one shield via 63, is denoted by point P4. The position of a fifth shield via, which is one shield via 63C, is denoted by point P5. The position of a sixth shield via, which is one shield via 63C, is denoted by point P6. The position of a seventh shield via, which is one shield via 63C, is denoted by point P7. The position of an eighth shield via, which is one shield via 63C, is denoted by point P8. The position of a ninth shield via, which is one shield via 63, is denoted by point P9. The position of a tenth shield via, which is one shield via 63, is denoted by point P10. The position of an 11th shield via, which is one shield via 63, is denoted by point P11. The position of a 12th shield via, which is one shield via 63, is denoted by point P12. The position of a 13th shield via, which is one shield via 63, is denoted by point P13. The position of a 14th shield via, which is one shield via 63, is denoted by point P14.

Terms "first portion X1, second portion X2, third portion X3, fourth portion X4, fifth portion X5, sixth portion X6, seventh portion X7, and eighth portion X8" may be used below. Each of the portions is hatched in FIG. 8. The insulating layer 2 is not illustrated in FIG. 8.

The term "plan view" may be used below. The "plan view" means, for example, observing in a direction orthogonal to the surface of the semiconductor substrate 1.

Figure 8:
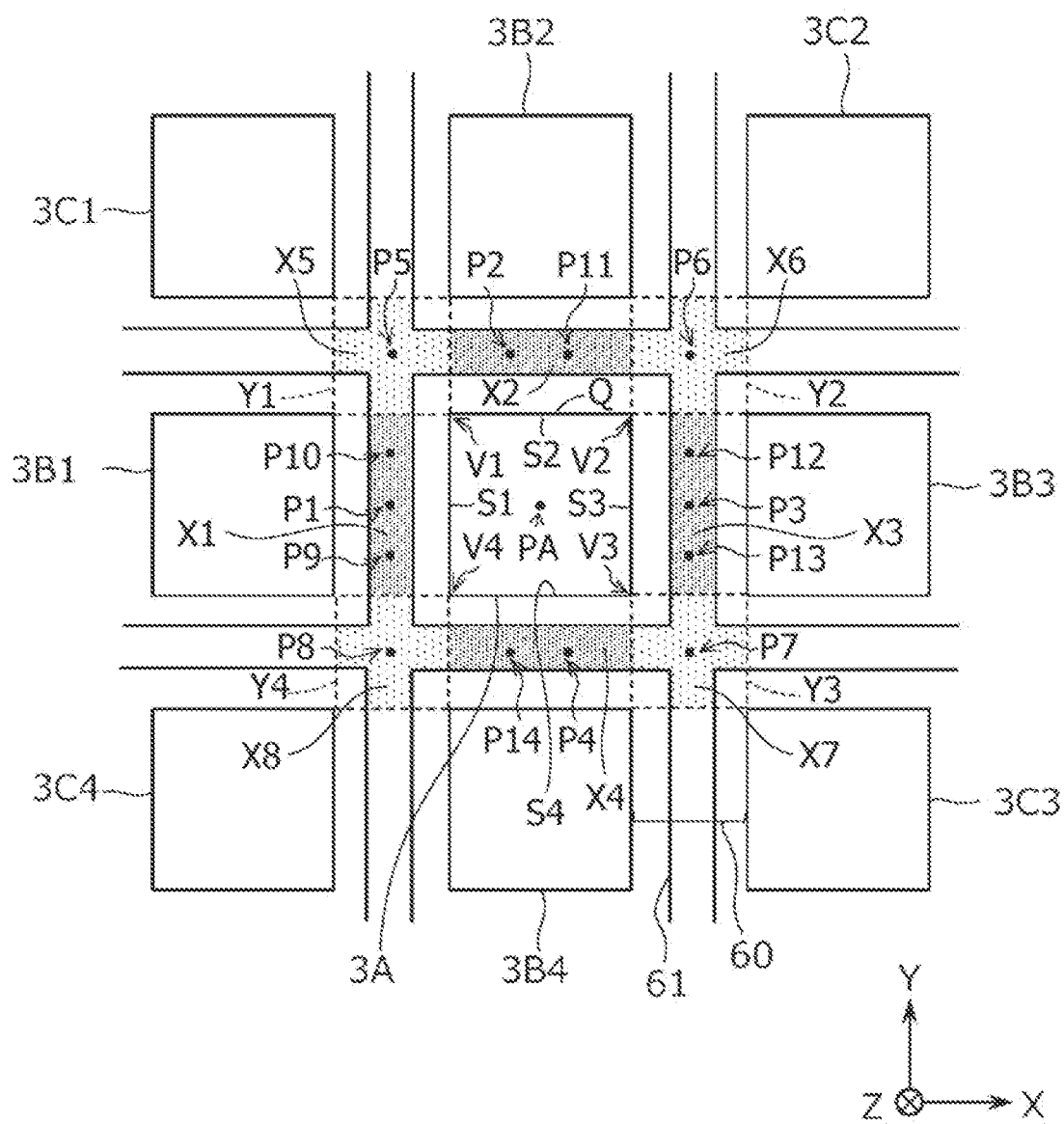
FIG. 8 is a view illustrating a planar structure of the imaging device according to the embodiment.

In the example illustrated in FIG. 8, the plurality of pixel electrodes 3 includes a first pixel electrode 3A, a first adjacent pixel electrode 3B1, a second adjacent pixel electrode 3B2, a third adjacent pixel electrode 3B3, and a fourth adjacent pixel electrode 3B4. The first adjacent pixel electrode 3B1, the second adjacent pixel electrode 3B2, the third adjacent pixel electrode 3B3, and the fourth adjacent pixel electrode 3B4 are adjacent to the first pixel electrode 3A.

In the example illustrated in FIG. 8, the plurality of pixel electrodes 3 further includes a first specific pixel electrode 3C1, a second specific pixel electrode 3C2, a third specific pixel electrode 3C3, and a fourth specific pixel electrode 3C4. The first specific pixel electrode 3C1 is adjacent to the first adjacent pixel electrode 3B1 and the second adjacent pixel electrode 3B2. The second specific pixel electrode 3C2 is adjacent to the second adjacent pixel electrode 3B2 and the third adjacent pixel electrode 3B3. The third specific pixel electrode 3C3 is adjacent to the third adjacent pixel electrode 3B3 and the fourth adjacent pixel electrode 3B4. The fourth specific pixel electrode 3C4 is adjacent to the fourth adjacent pixel electrode 3B4 and the first adjacent pixel electrode 3B1.

The shield electrode 61 includes the first portion X1, the second portion X2, the third portion X3, and the fourth portion X4. At least one shield via is connected to the shield electrode 61. The at least one shield via includes the first shield via, the second shield via, the third shield via, and the fourth shield via. The first shield via extends from the first portion X1 toward the semiconductor substrate 1. The second shield via extends from the second portion X2 toward the semiconductor substrate 1. The third shield via extends from the third portion X3 toward the semiconductor substrate 1. The fourth shield via extends from the fourth portion X4 toward the semiconductor substrate 1.

In plan view, the first pixel electrode 3A has a quadrangle Q in which a first side S1, a second side S2, a third side S3, and a fourth side S4 are connected in that order. In plan view, the first portion X1 is located between the first side S1 and the first adjacent pixel electrode 3B1. In plan view, the second portion X2 is located between the second side S2 and the second adjacent pixel electrode 3B2. In plan view, the third portion X3 is located between the third side S3 and the third adjacent pixel electrode 3B3. In plan view, the fourth portion X4 is located between the fourth side S4 and the fourth adjacent pixel electrode 3B4.

In the example illustrated in FIG. 8, specifically, in plan view, the first side S1 opposes the first adjacent pixel electrode 3B1 with the first portion X1 being interposed therebetween. In plan view, the second side S2 opposes the second adjacent pixel electrode 3B2 with the second portion X2 being interposed therebetween. In plan view, the third side S3 opposes the third adjacent pixel electrode 3B3 with the third portion X3 being interposed therebetween. In plan view, the fourth side S4 opposes the fourth adjacent pixel electrode 3B4 with the fourth portion X4 being interposed therebetween.

In the example illustrated in FIG. 8, the shield electrode 61 further includes the fifth portion X5, the sixth portion X6, the seventh portion X7, and the eighth portion X8. The at least one shield via further includes the fifth shield via, the sixth shield via, the seventh shield via, and the eighth shield via. The fifth shield via extends from the fifth portion X5 toward the semiconductor substrate 1. The sixth shield via extends from the sixth portion X6 toward the semiconductor substrate 1. The seventh shield via extends from the seventh portion X7 toward the semiconductor substrate 1. The eighth shield via extends from the eighth portion X8 toward the semiconductor substrate 1.

In plan view, the pixel electrodes 3 are spaced from each other, with a lattice-shaped region 60 being interposed therebetween. The lattice-shaped region 60 includes a plurality of intersection portions. In plan view, the shield electrode 61 is located in the lattice-shaped region 60.

In plan view, the quadrangle Q includes a first vertex V1, a second vertex V2, a third vertex V3, and a fourth vertex V4. The first vertex V1 is a vertex at which the first side S1 and the second side S2 contact each other. The second vertex V2 is a vertex at which the second side S2 and the third side S3 contact each other. The third vertex V3 is a vertex at which the third side S3 and the fourth side S4 contact each other. The fourth vertex V4 is a vertex at which the fourth side S4 and the first side S1 contact each other.

In plan view, the plurality of intersection portions includes a first intersection portion Y1, a second intersection portion Y2, a third intersection portion Y3, and a fourth intersection portion Y4. In plan view, of the plurality of intersection portions, the first intersection portion Y1 is the closest to the first vertex V1. In plan view, of the plurality of intersection portions, the second intersection portion Y2 is the closest to the second vertex V2. Of the plurality of intersection portions, the third intersection portion Y3 is the closest to the third vertex V3. Of the plurality of intersection portions, the fourth intersection portion Y4 is the closest to the fourth vertex V4.

In plan view, the fifth portion X5 is located at the first intersection portion Y1. In plan view, the sixth portion X6 is located at the second intersection portion Y2. In plan view, the seventh portion X7 is located at the third intersection portion Y3. In plan view, the eighth portion X8 is located at the fourth intersection portion Y4.

In the example illustrated in FIG. 8, the at least one shield via further includes the ninth shield via, the tenth shield via, the 11th shield via, the 12th shield via, the 13th shield via, and the 14th shield via. The ninth shield via and the tenth shield via extend from the first portion X1 toward the semiconductor substrate 1. The 11th shield via extends from the second portion X2 toward the semiconductor substrate 1. The 12th shield via and the 13th shield via extend from the third portion X3 toward the semiconductor substrate 1. The 14th shield via extends from the fourth portion X4 toward the semiconductor substrate 1.

The vias connected to the shield electrode 61 contribute to acquiring images with high resolution. Specifically, when the first to 14th shield vias are provided in the manner described above, the number of shield vias 63, 63C that surround one pixel electrode 3 in plan view increases, and the crosstalk reduction effect increases. It is also possible to reduce crosstalk between the pixels located in oblique directions. Accordingly, images with higher resolution can be easily acquired. In the example illustrated in FIG. 8, the oblique directions are directions in which each diagonal of the quadrangle Q extends in plan view.

Some of the shield vias 63, 63C (described above) connected to the shield electrode 61 may be omitted. Shield vias 63, 63C that extend from the shield electrode 61 toward the semiconductor substrate 1 may also be added.

In the example illustrated in FIG. 8, the imaging device 100 includes the pixel vias 13. In the example illustrated in FIG. 8, one pixel via 13 is connected to the first pixel electrode 3A. The pixel via 13 extends from the first pixel electrode 3A toward the semiconductor substrate 1. In FIG. 8, the position of the pixel via 13 is denoted by point PA. Although not illustrated, not only does the pixel via 13 extend from the pixel electrode 3A at the center in the example illustrated in FIG. 8, but also the pixel vias extend from the other eight pixel electrodes 3B1 to 3B4 and 3C1 to 3C4 toward the semiconductor substrate 1.

In such an imaging device 100, the shield vias 63, 63C, which are connected to the shield electrodes 61, can suppress noise being superimposed on the signal charge that flows to the pixel via 13 connected to the first pixel electrode 3A, the noise stemming from parasitic capacitance between the pixel via 13 and the pixel via connected to the adjacent pixel electrode. Thus, such an imaging device 100 is suitable for acquiring images with high resolution.

In one specific example, in plan view, the pixel via 13 connected to the first pixel electrode 3A is surrounded by the first shield via, the second shield via, the third shield via, the fourth shield via, and the fifth shield via.

In another specific example, in plan view, the pixel via 13 connected to the first pixel electrode 3A is surrounded by the first shield via, the second shield via, the third shield via, the fourth shield via, the fifth shield via, the sixth shield via, the seventh shield via, and the eighth shield via.

In yet another specific example, in plan view, the pixel via 13 connected to the first pixel electrode 3A is surrounded by the first shield via, the second shield via, the third shield via, the fourth shield via, the fifth shield via, the sixth shield via, the seventh shield via, the eighth shield via, the ninth shield via, the tenth shield via, the 11th shield via, the 12th shield via, the 13th shield via, and the 14th shield via.

In the example illustrated in FIG. 8, the at least one shield via extends from the shield electrode 61 to the first wiring layer 14. Such an arrangement is suitable for acquiring images with high resolution.

In the example illustrated in FIG. 8, the quadrangle Q is a rectangle. The quadrangle Q may be a square.

In the example illustrated in FIG. 8, in plan view, the first adjacent pixel electrode 3B1, the second adjacent pixel electrode 3B2, the third adjacent pixel electrode 3B3, and the fourth adjacent pixel electrode 3B4 each have a quadrangle. Typically, in plan view, the first adjacent pixel electrode 3B1, the second adjacent pixel electrode 3B2, the third adjacent pixel electrode 3B3, and the fourth adjacent pixel electrode 334 each have the same shape and dimensions as those of the quadrangle Q.

In the example illustrated in FIG. 8, in plan view, the first adjacent pixel electrode 3B1 and the third adjacent pixel electrode 3B3 are adjacent to the first pixel electrode 3A in directions in which the second side S2 and the fourth side S4 extend. The second adjacent pixel electrode 332 and the fourth adjacent pixel electrode 3B4 are adjacent to the first pixel electrode 3A in directions in which the first side S1 and the third side S3 extend.

In the example illustrated in FIG. 8, the shield electrode 61, which is a single electrical conductor, shields the plurality of pixel electrodes 3. Specifically, the single electrical conductor has a lattice shape in plan view. However, another form may also be used. For example, the shield electrode 61 may be electrically isolated into a plurality of portions that individually shield the corresponding pixel electrodes 3.

Features of the imaging device will be described below with reference to FIGS. 9A to 9E. A description that is the same as the above description may be given below. The contents of the description below may be combined with the contents of the above description. The terms used in the description below can also be replaced with the terms used in the above description. The insulating layer 2 is not illustrated in FIGS. 9A to 9E.

Figure 9A:
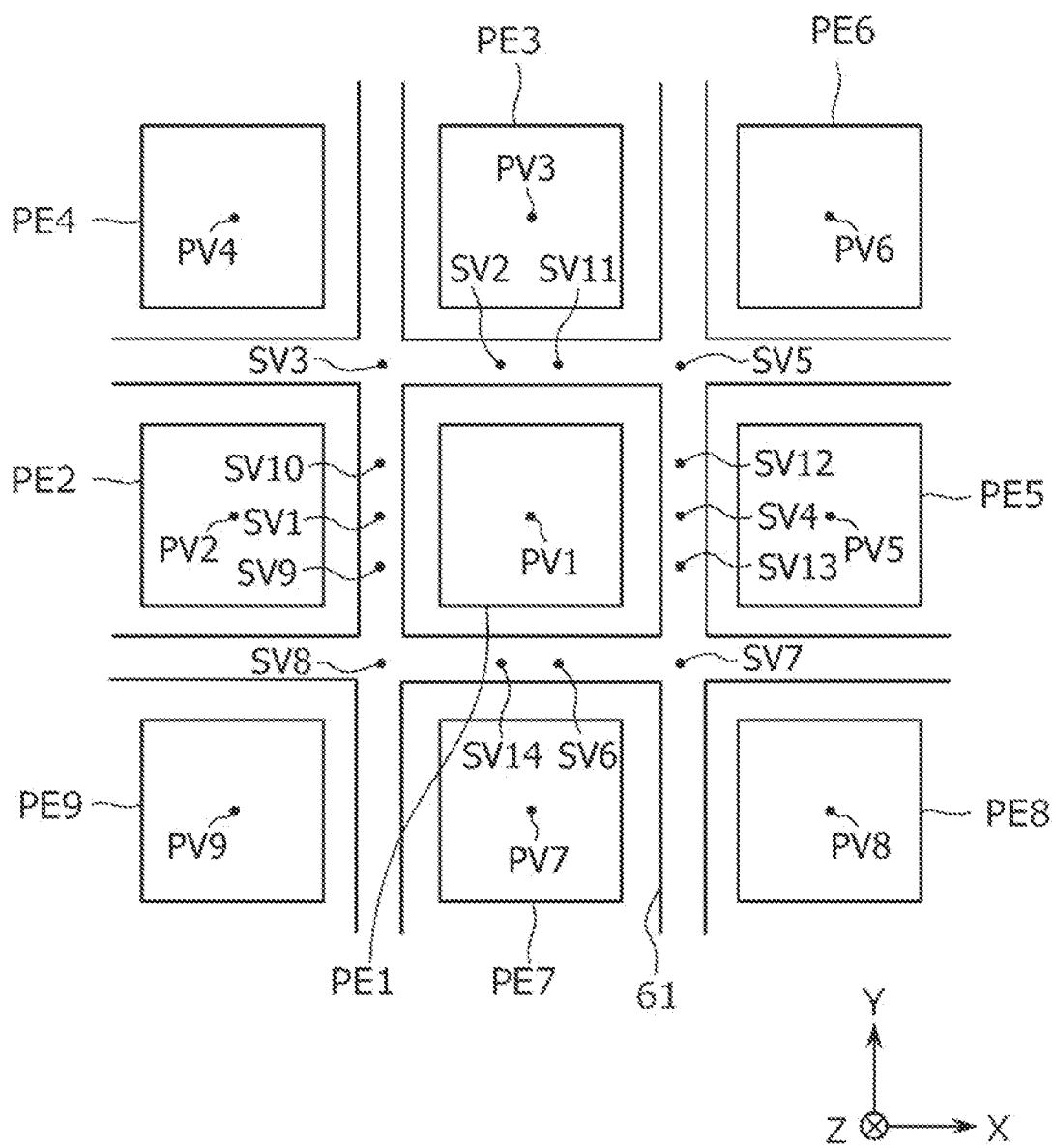
FIG. 9A is a view illustrating a planar structure of the imaging device according to the embodiment.

A first shield via SV1 in FIG. 9A corresponds to the first shield via at point P1 in FIG. 8. A second shield via SV2 in FIG. 9A corresponds to the second shield via at point P2 in FIG. 8. A third shield via SV3 in FIG. 9A corresponds to the fifth shield via at point P5 in FIG. 8. A fourth shield via SV4 in FIG. 9A corresponds to the third shield via at point P3 in FIG. 8. A fifth shield via SV5 in FIG. 9A corresponds to the sixth shield via at point P6 in FIG. 8. A sixth shield via SV6 in FIG. 9A corresponds to the fourth shield via at point P4 in FIG. 8. A seventh shield via SV7 in FIG. 9A corresponds to the seventh shield via at point P7 in FIG. 8. An eighth shield via SV8 in FIG. 9A corresponds to the eighth shield via at point P8 in FIG. 8. A ninth shield via SV9 in FIG. 9A corresponds to the ninth shield via at point P9 in FIG. 8. A tenth shield via SV10 in FIG. 9A corresponds to the tenth shield via at point P10 in FIG. 8. An 11th shield via SV11 in FIG. 9A corresponds to the 11th shield via at point P11 in FIG. 8, A 12th shield via SV12 in FIG. 9A corresponds to the 12th shield via at point P12 in FIG. 8. A 13th shield via SV13 in FIG. 9A corresponds to the 13th shield via at point P13 in FIG. 8. A 14th shield via SV14 in FIG. 9A corresponds to the 14th shield via at point P14 in FIG. 8.

The shield vies SV1 to SV14 extend from the shield electrode 61. Specifically, the shield vies SV1 to SV14 extend from the shield electrode 61 in a direction in which the distance from the light-incidence surface increases. The shield vias SV1 to SV14 can also be said to extend downward from the shield electrode 61. In this example, the shield vies SV1 to SV14 extend to the first wiring layer 14.

A first pixel electrode PE1 in FIG. 9A corresponds to the first pixel electrode 3A in FIG. 8. A second pixel electrode PE2 in FIG. 9A corresponds to the first adjacent pixel electrode 3B1 in FIG. 8. A third pixel electrode PE3 in FIG. 9A corresponds to the second adjacent pixel electrode 3B2 in FIG. 8. A fourth pixel electrode PE4 in FIG. 9A corresponds to the first specific pixel electrode 3C1 in FIG. 8. A fifth pixel electrode PE5 in FIG. 9A corresponds to the third adjacent pixel electrode 3B3 in FIG. 8. A sixth pixel electrode PE6 in FIG. 9A corresponds to the second specific pixel electrode 3C2 in FIG. 8. A seventh pixel electrode PE7 in FIG. 9A corresponds to the fourth adjacent pixel electrode 3B4 in FIG. 8. An eighth pixel electrode PE8 in FIG. 9A corresponds to the third specific pixel electrode 3C3 in FIG. 8. A ninth pixel electrode PE9 in FIG. 9A corresponds to the fourth specific pixel electrode 3C4 in FIG. 8. Each of the first pixel electrode PE1 to the ninth pixel electrode PE9 collects charge. The first pixel electrode PE1 to the ninth pixel electrode PE9 are electrically isolated from the shield electrode 61.

The first pixel electrode PE1 is adjacent to the second pixel electrode PE2, the third pixel electrode PE3, the fifth pixel electrode PE5, and the seventh pixel electrode PE7. The fourth pixel electrode PE4 is adjacent to the second pixel electrode PE2 and the third pixel electrode PE3. The sixth pixel electrode PE6 is adjacent to the third pixel electrode PE3 and the fifth pixel electrode PE5. The eighth pixel electrode PE8 is adjacent to the fifth pixel electrode PE5 and the seventh pixel electrode PE7. The ninth pixel electrode PE9 is adjacent to the seventh pixel electrode PE7 and the second pixel electrode PE2.

Specifically, the first pixel electrode PE1 and the second pixel electrode PE2 are adjacent to each other in first directions. The first pixel electrode PE1 and the third pixel electrode PE3 are adjacent to each other in second directions. The first pixel electrode PE1 and the fifth pixel electrode PE5 are adjacent to each other in the first directions. The first pixel electrode PE1 and the seventh pixel electrode PE7 are adjacent to each other in the second directions. The fourth pixel electrode PE4 and the second pixel electrode PE2 are adjacent to each other in the second directions. The fourth pixel electrode PE4 and the third pixel electrode PE3 are adjacent to each other in the first directions. The sixth pixel electrode PEG and the third pixel electrode PE3 are adjacent to each other in the first directions. The sixth pixel electrode PEG and the fifth pixel electrode PE5 are adjacent to each other in the second directions. The eighth pixel electrode PE8 and the fifth pixel electrode PE5 are adjacent to each other in the second directions. The eighth pixel electrode PE8 and the seventh pixel electrode PE7 are adjacent to each other in the first directions. The ninth pixel electrode PE9 and the seventh pixel electrode PE7 are adjacent to each other in the first directions. The ninth pixel electrode PE9 and the second pixel electrode PE2 are adjacent to each other in the second directions.

In this case, the first directions are different from the second directions. In the illustrated example, the first directions are orthogonal to the second directions. The illustrated example, the first directions are row directions. The second directions are column directions. Also, in the illustrated example, the first directions correspond to the X-axis directions. The second directions correspond to the Y-axis directions.

Figure 9B:
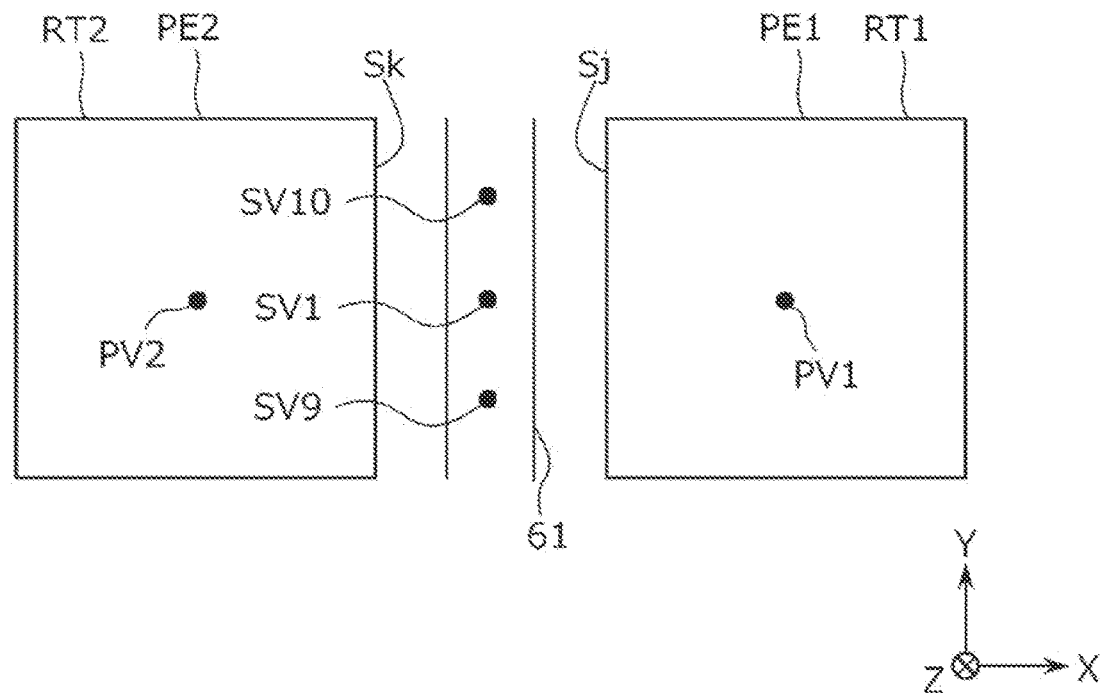
FIG. 9B is a partially enlarged view of FIG. 9A.

The expression the first pixel electrode PE1 and the second pixel electrode PE2 are adjacent to each other will be described with reference to FIGS. 9B and 9C. This expression means that, in plan view, a side Sj of a smallest rectangle RT1 that encompasses the first pixel electrode PE1 and a side Sk of a smallest rectangle RT2 that encompasses the second pixel electrode PE2 oppose each other. The rectangle is a concept including a square. Specifically, the expression "the first pixel electrode PE1 and the second pixel electrode PE2 are adjacent to each other" means that, in plan view, a normal to the side Sj crosses the side Sk, and a normal to the side Sk crosses the side Sj. The normal to the side Sj may be any line that crosses any point on the side Sj. The normal to the side Sk may be any line that crosses any point on the side Sk. In one specific example, in plan view, the perpendicular bisector of the side Sj crosses a midpoint on the side Sk, and the perpendicular bisector of the side Sk crosses a midpoint on the side Sj. The same also applies to expressions regarding other pixel electrodes being adjacent to each other, for example, the first pixel electrode PE1 and the third pixel electrode PE3 being adjacent to each other, and specific examples of such an arrangement.

In the example illustrated in FIGS. 3, 8, 9A, and 9B, in plan view, the smallest rectangle RT1 that encompasses the first pixel electrode PE1 is substantially the same as the contour of the first pixel electrode PE1. The same also applies to other pixel electrodes, such as the second pixel electrode PE2.

Figure 9C:
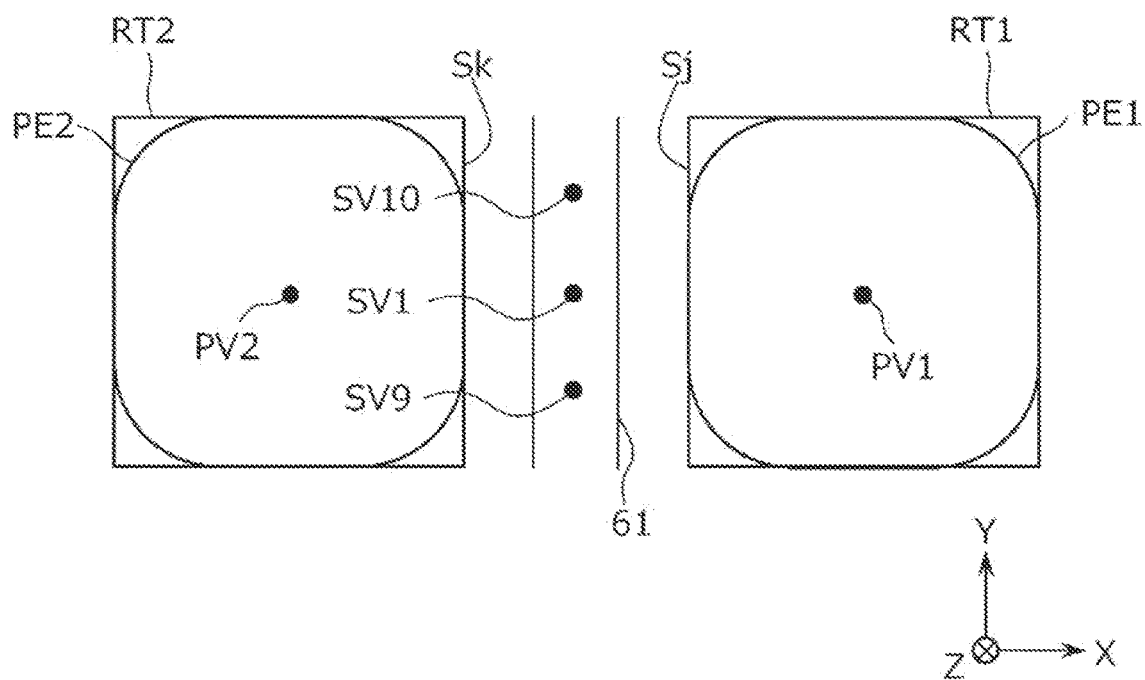
FIG. 9C is a partially enlarged view according to an example that is different from the example in FIG. 9B.

However, as illustrated in FIG. 9C, the contour of the first pixel electrode PE1 may be rounded in plan view. In the example in FIG. 9C, a smallest rectangle RT1 that encompasses the first pixel electrode PE1 is different from the contour of the first pixel electrode PE1. Other pixel electrodes, such as the second pixel electrode PE2, can also have the shape illustrated in FIG. 9C. In practice, for example, when the size of the pixel electrodes is small, the pixel electrodes tend to be rounded in plan view.

In the example illustrated in FIGS. 3, 8, and 9A, the pixels are arranged in a matrix to thereby constitute a pixel array. The expression "one pixel electrode and another pixel electrode are adjacent to each other" when such a pixel array is constituted means that these pixel electrodes are neighboring to each other in the row directions or the column directions and does not mean that these pixel electrodes are arranged in oblique directions, which are inclined relative to the row directions and the column directions. In the example illustrated in FIGS. 3, 8, and 9A, the row directions correspond to left-and-right directions, and the column directions correspond to up-and-down directions.

Referring back to FIG. 9A, a first pixel via PV1 extends from the first pixel electrode PE1 The first pixel via PV1 in FIG. 9A corresponds to the pixel via 13 at point PA in FIG. 8. A second pixel via PV2 extends from the second pixel electrode PE2. A third pixel via PV3 extends from the third pixel electrode PE3. A fourth pixel via PV4 extends from the fourth pixel electrode PE4. A fifth pixel via PV5 extends from the fifth pixel electrode PE5. A sixth pixel via PV6 extends from the sixth pixel electrode PE6. A seventh pixel via PV7 extends from the seventh pixel electrode PE7. An eighth pixel via PV8 extends from the eighth pixel electrode PE8. A ninth pixel via PV9 extends from the ninth pixel electrode PE9. The first pixel via PV1 to the ninth pixel via PV9 can electrically connect the first pixel electrode PE1 to the ninth pixel electrode PE9 to other elements. Specific examples of the other elements include wiring layers, the detection circuits 12, and so on.

In plan view, the first shield via SV1 is located between the first pixel electrode PE1 and the second pixel electrode PE2. In plan view, the second shield via SV2 is located between the first pixel electrode PE1 and the third pixel electrode PE3. In plan view, the fourth shield via SV4 is located between the first pixel electrode PE1 and the fifth pixel electrode PE5. In plan view, the sixth shield via SV6 is located between the first pixel electrode PE1 and the seventh pixel electrode PE7. In plan view, the ninth shield via SV9 is located between the first pixel electrode PE1 and the second pixel electrode PE2. In plan view, the tenth shield via SV10 is located between the first pixel electrode PE1 and the second pixel electrode PE2. In plan view, the 11th shield via SV11 is located between the first pixel electrode PE1 and the third pixel electrode PE3. In plan view, the 12th shield via SV12 is located between the first pixel electrode PE1 and the fifth pixel electrode PE5. In plan view, the 13th shield via SV13 is located between the first pixel electrode PE1 and the fifth pixel electrode PE5. In plan view, the 14th shield via SV14 is located between the first pixel electrode PE1 and the seventh pixel electrode PE7. The presence of the shield vias between two pixel electrodes in plan view, as described above, is suitable for acquiring images with high resolution.

The expression "the first shield via SV1 is located between the first pixel electrode PE1 and the second pixel electrode PE2 in plan view" means that, in plan view, the first shield via SV1 exists on a line segment whose one end is a point on the aforementioned side Sj and whose another end is a point on the aforementioned side Sk. In one specific example, in plan view, a portion at which the shield electrode 61 and the first shield via SV1 are connected to each other exists on the line segment. The same also applies to expressions regarding the arrangement of the shield vias between other two adjacent pixel electrodes, for example, the expression "the second shield via SV2 is located between the first pixel electrode PE1 and the third pixel electrode PE3 in plan view", and specific examples of such an arrangement. Since the shield vias are located between two adjacent pixel electrodes in plan view, the shield vias can shield at least part of electric lines of force between the pixel electrodes.

In the illustrated example, the number of shield vias located between the first pixel electrode PE1 and the second pixel electrode PE2 in plan view and the number of shield vias located between the first pixel electrode PE1 and the third pixel electrode PE3 in plan view are different from each other. The number of shield vias located between the first pixel electrode PE1 and the third pixel electrode PE3 in plan view and the number of shield vias located between the first pixel electrode PE1 and the fifth pixel electrode PE5 in plan view are different from each other. The number of shield vias located between the first pixel electrode PE1 and the fifth pixel electrode PE5 in plan view and the number of shield vias located between the first pixel electrode PE1 and the seventh pixel electrode PE7 in plan view are different from each other. The number of shield vias located between the first pixel electrode PE1 and the seventh pixel electrode PE7 in plan view and the number of shield vias located between the first pixel electrode PE1 and the second pixel electrode PE2 in plan view are different from each other.

In the illustrated example, the number of shield vias located between the first pixel electrode PE1 and the second pixel electrode PE2 in plan view and the number of shield vias located between the first pixel electrode PE1 and the fifth pixel electrode PE5 in plan view are the same. In plan view, the number of shield vias located between the first pixel electrode PE1 and the third pixel electrode PE3 and the number of shield vias located between the first pixel electrode PE1 and the seventh pixel electrode PE7 in plan view are the same.

Specifically, in plan view, three shield vias, that is, the first shield via SV1, the ninth shield via SV9, and the tenth shield via SV10, are located between the first pixel electrode PE1 and the second pixel electrode PE2. In plan view, two shield vias, that is, the second shield via SV2 and the 11th shield via SV11, are located between the first pixel electrode PE1 and the third pixel electrodes PE3. In plan view, three shield vias, that is, the fourth shield via SV4, the 12th shield via SV12, and the 13th shield via SV13, are located between the first pixel electrode PE1 and the fifth pixel electrode PE5. In plan view, two shield vias, that is, the sixth shield via SV6 and the 14th shield via SV14, are located between the first pixel electrode PE1 and the seventh pixel electrode PE7.

In the illustrated example, in plan view, the third shield via SV3 is located between the first pixel electrode PE1 and the fourth pixel electrode PE4. In plan view, the fifth shield via SV5 is located between the first pixel electrode PE1 and the sixth pixel electrode PE6. In plan view, the seventh shield via SV7 is located between the first pixel electrode PE1 and the eighth pixel electrode PE8. In plan view, the eighth shield via SV8 is located between the first pixel electrode PE1 and the ninth pixel electrode PE9. Such an arrangement also makes it possible to reduce crosstalk between the pixels that are arranged in the oblique directions. Accordingly, images with higher resolution can be easily acquired. In the example in FIG. 9A, in plan view, the contour of the first pixel electrode PE1 is a quadrangle, and the oblique directions are directions in which each diagonal of the quadrangle extends.

The expression "the third shield via SV3 is located between the first pixel electrode PE1 and the fourth pixel electrode PE4 in plan view" will be described with reference to FIG. 9D. The expression means that, in plan view, the third shield via SV3 is located in a square Sx2 whose diagonal is a line segment that connects two opposing vertices, that is, a vertex of the smallest rectangle RT1 that encompasses the first pixel electrode PE1 and a vertex of a smallest rectangle RT4 that encompasses the fourth pixel electrode PE4. The two opposing vertices are selected so that the square Sx2 becomes the smallest. In one specific example, in plan view, a portion at which the shield electrode 61 and the third shield via SV3 are connected to each other exists in the square Sx2. The same also applies to expressions regarding the arrangement of shield vias between other two pixel electrodes, for example, the expression "the fifth shield via SV5 is located between the first pixel electrode PE1 and the sixth pixel electrode PE6 in plan view", and specific examples of such an arrangement. Since the shield vias are located between two pixel electrodes in plan view, the shield vias can shield at least part of electric lines of force between the two pixel electrodes.

In the illustrated example, in plan view, the third shield via SV3 is located among the first pixel electrode PE1, the second pixel electrode PE2, the third pixel electrode PE3, and the fourth pixel electrode PE4. In plan view, the fifth shield via SV5 is located among the first pixel electrode PE1, the third pixel electrode PE3, the fifth pixel electrode PE5, and the sixth pixel electrode PE6. In plan view, the seventh shield via SV7 is located among the first pixel electrode PE1, the fifth pixel electrode PE5, the seventh pixel electrode PE7, and the eighth pixel electrode PE8. In plan view, the eighth shield via SV8 is located among the first pixel electrode PE1, the seventh pixel electrode PE7, the second pixel electrode PE2, and the ninth pixel electrode PE9. The presence of the via among four pixel electrodes in plan view, as described above, is suitable for acquiring images with high resolution.

The expression "the third shield via SV3 is located among the first pixel electrode PE1, the second pixel electrode PE2, the third pixel electrode PE3, and the fourth pixel electrode PE4 in plan view" will be described with reference to FIG. 9E. This expression means that, in plan view, the third shield via SV3 is located in a quadrangle Sx4 defined by four opposing vertices, that is, a vertex of the smallest rectangle RT1 that encompasses the first pixel electrode PE1, a vertex of the smallest rectangle RT2 that encompasses the second pixel electrode PE2, a vertex of a smallest rectangle RT3 that encompasses the third pixel electrode PE3, and a vertex of the smallest rectangle RT4 that encompasses the fourth pixel electrode PE4. The four opposing vertices are selected so that the quadrangle Sx4 becomes the smallest. In one specific example, in plan view, a portion at which the shield electrode 61 and the third shield via SV3 are connected to each other exists in the quadrangle Sx4. The same also applies to expressions regarding the arrangement of the shield via among other four pixel electrodes, for example, the expression "the fifth shield via SV5 is located among the first pixel electrode PE1, the third pixel electrode PE3, fourth pixel electrode PE5, and the sixth pixel electrode PE6 in plan view", and specific examples of such an arrangement. Since the shield via is located among four pixel electrodes in plan view, the shield via can shield at least part of electric lines of force among the four pixel electrodes.

Figure 9D:
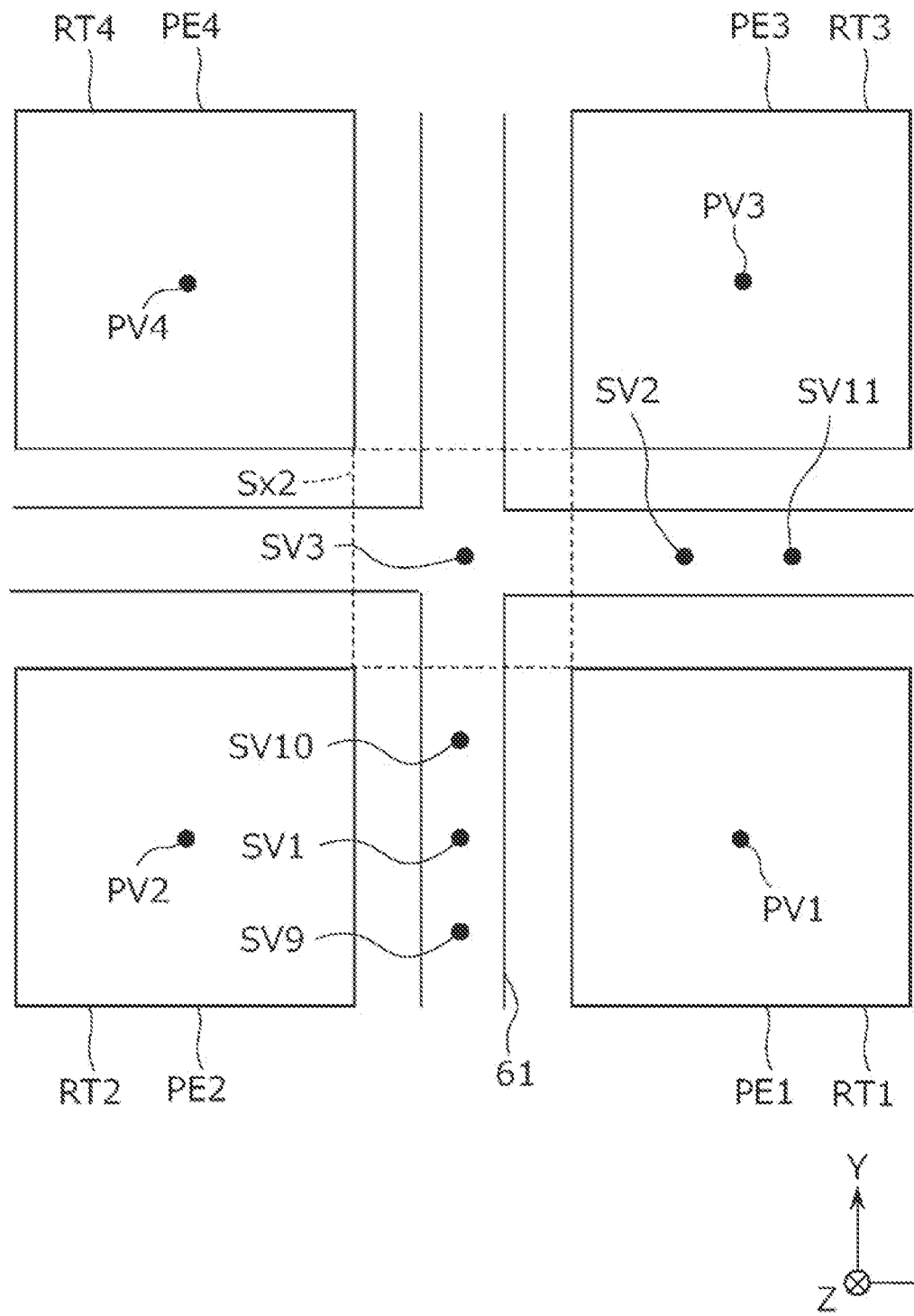
FIG. 9D is a partially enlarged view of FIG. 9A.
Figure 9E:
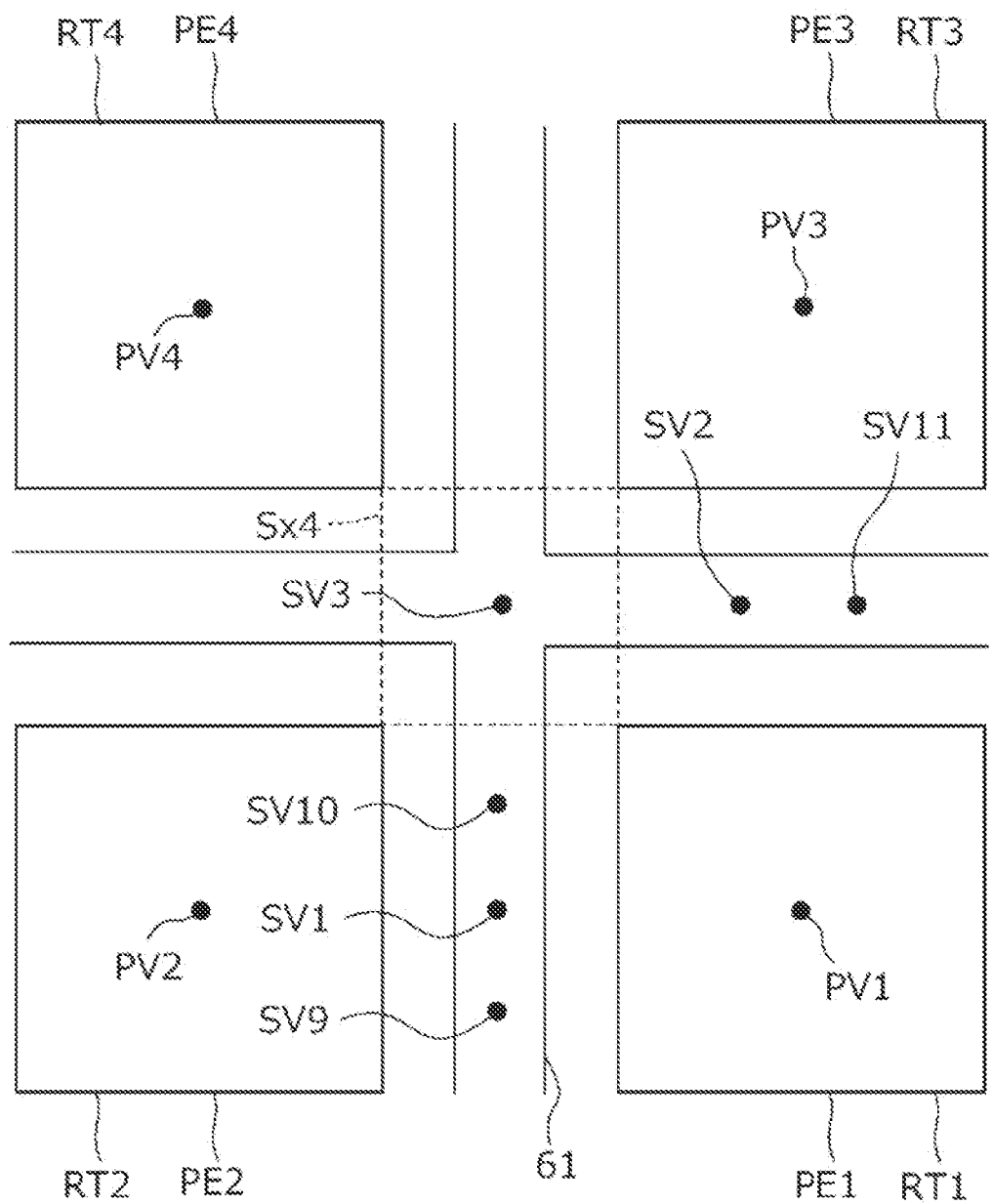
FIG. 9E is a partially enlarged view of FIG. 9A.

The quadrangle Sx4 in FIG. 9E may correspond to the square Sx2 in FIG. 9D. The square Sx2 in FIG. 9D and the quadrangle Sx4 in FIG. 9E may correspond to the first intersection portion Y1 in FIG. 8. The above descriptions made with reference to FIGS. 9D and 9E can also true for a case in which each pixel electrode is rounded in plan view, as illustrated in FIG. 9C.

Referring back to FIG. 9A, in plan view, the first shield via SV1 is located between the first pixel via PV1 and the second pixel via PV2. In plan view, the third shield via SV3 is located between the first pixel via PV1 and the fourth pixel via PV4. In plan view, the fourth shield via SV4 is located between the first pixel via PV1 and the fifth pixel via PV5. In plan view, the fifth shield via SV5 is located between the first pixel via PV1 and the sixth pixel via PV6. In plan view, the seventh shield via SV7 is located between the first pixel via PV1 and the eighth pixel via PV8. In plan view, the eighth shield via SV8 is located between the first pixel via PV1 and the ninth pixel via PV9.

The expression "the first shield via SV1 is located between the first pixel via PV1 and the second pixel via PV2 in plan view" means that, in plan view, the first shield via SV1 exists on a line segment whose one end is the first pixel via PV1 and whose another end is the second pixel via PV2. In one specific example, in plan view, a portion at which the shield electrode 61 and the first shield via SV1 are connected to each other exists on a line segment whose one end is a portion at which the first pixel electrode PE1 and the first pixel via PV1 are connected to each other and whose another end is a portion at which the second pixel electrode PE2 and the second pixel via PV2 are connected to each other. The same applies to expressions regarding the arrangement of the vias between other pixel vias, for example, the expression "the third shield via SV3 is located between the first pixel via PV1 and the fourth pixel via PV4 in plan view", and specific examples of such an arrangement. Arranging the shield vias between the pixel vias in plan view allows the shield vias to shield at least part of electric lines of force between the pixel vias.

Although not illustrated in FIG. 9A, in plan view, the insulating portion 62 is spaced from the first pixel electrode PE1, the second pixel electrode PE2, the third pixel electrode PE3, the fourth pixel electrode PE4, the fifth pixel electrode PE5, the sixth pixel electrode PE6, the seventh pixel electrode PE7, the eighth pixel electrode PE8, and the ninth pixel electrode PE9.

In plan view, the shield electrode 61 extends between the first pixel electrode PE1 and the second pixel electrode PE2. In plan view, the shield electrode 61 extends between the first pixel electrode PE1 and the third pixel electrode PE3. In plan view, the shield electrode 61 extends between the first pixel electrode PE1 and the fifth pixel electrode PE5. In plan view, the shield electrode 61 extends between the first pixel electrode PE1 and the seventh pixel electrode PE7. In plan view, the shield electrode 61 extends between the fourth pixel electrode PE4 and the second pixel electrode PE2. In plan view, the shield electrode 61 extends between the fourth pixel electrode PE4 and the third pixel electrode PE3. In plan view, the shield electrode 61 extends between the sixth pixel electrode PEG and the third pixel electrode PE3. In plan view, the shield electrode 61 extends between the sixth pixel electrode PE6 and the fifth pixel electrode PEG. In plan view, the shield electrode 61 extends between the eighth pixel electrode PE8 and the fifth pixel electrode PE5. In plan view, the shield electrode 61 extends between the eighth pixel electrode PE8 and the seventh pixel electrode PE7. In plan view, the shield electrode 61 extends between the ninth pixel electrode PE9 and the seventh pixel electrode PE7. In plan view, the shield electrode 61 extends between the ninth pixel electrode PE9 and the second pixel electrode PE2.

(Camera System)

A camera system to which the above-described imaging device 100 is applied will be described below with reference to FIG. 10.

Figure 10:
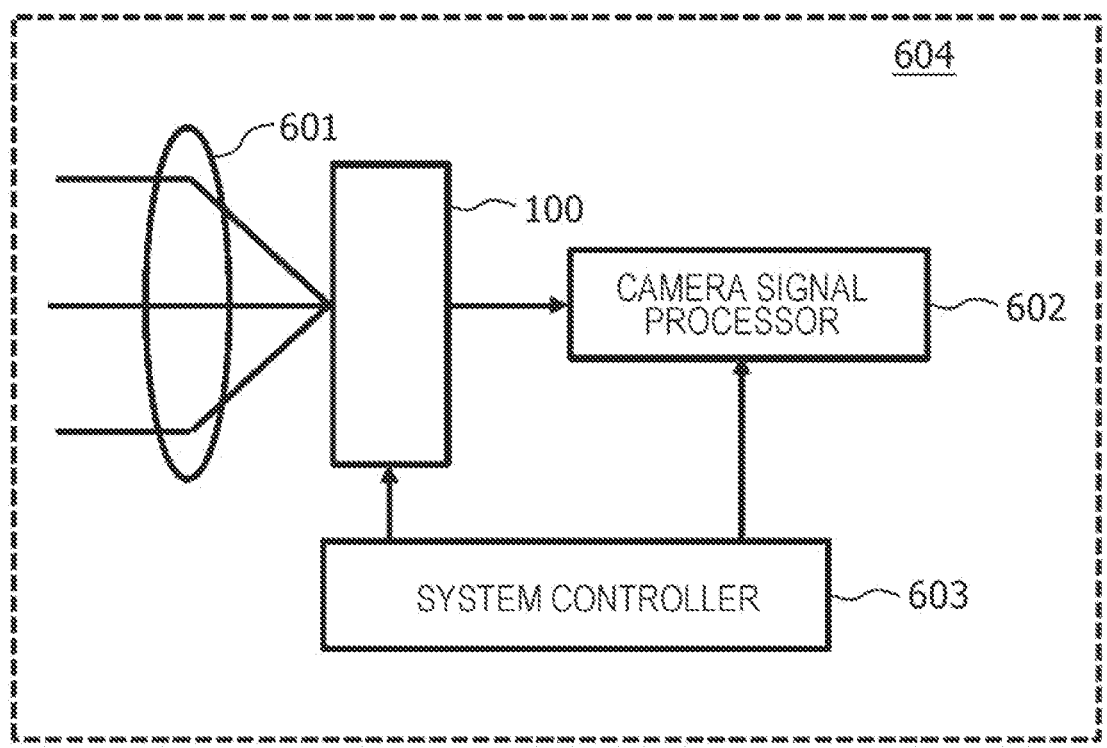
FIG. 10 is a block diagram of a camera system.

In the example illustrated in FIG. 10, a camera system 604 includes the imaging device 100, an optical system 601, a camera signal processor 602, and a system controller 603.

The optical system 601 concentrates light. The optical system 601 includes, for example, a lens.

The camera signal processor 602 performs signal processing on data resulting from image capture performed by the imaging device 100 and outputs a resulting image or data.

The system controller 603 controls the imaging device 100 and the camera signal processor 602.

The imaging device according to the present disclosure can be used for various sensor systems and camera systems, such as digital still cameras, medical cameras, surveillance cameras, vehicle-mounted cameras, digital single-lens reflex cameras, and digital mirrorless single-lens reflex cameras.

Although the imaging device in the present disclosure has been described above in conjunction with the embodiment, the imaging device and its manufacturing method according to the present disclosure are not limited to the above-described embodiment. Other embodiments realized by combining arbitrary constituent elements in the above-described embodiment, modifications obtained by making various changes conceived by those skilled in the art to the above-described embodiment within a scope not departing from the spirit of the present disclosure, and various types of equipment incorporating the imaging device in the present disclosure are also encompassed by the scope of the present disclosure.

What is claimed is:

1. An imaging device comprising:
   pixels that are disposed in a row direction and a column direction and that include a first pixel and a second pixel adjacent to the first pixel along the row direction;

a shield electrode located between the first pixel and the second pixel; and
a first shield via that extends from the shield electrode, wherein
the first pixel includes:
   a first photoelectric conversion layer that converts incident light to generate charge, and
   a first pixel electrode that collects the charge generated by the first photoelectric conversion layer,
the second pixel includes:
   a second photoelectric conversion layer that converts incident light to generate charge, and
   a second pixel electrode that collects the charge generated by the second photoelectric conversion layer,
the shield electrode is electrically isolated from the first pixel electrode and the second pixel electrode,
the first shield via is located between the first pixel electrode and the second pixel electrode in a plan view,
the shield electrode surrounds the first pixel electrode,
the shield electrode has four portions that surround the first pixel electrode and that are spaced from the first pixel electrode, and
the shortest distances between the first pixel electrode and the four portions are equal to each other.

2. The imaging device according to claim 1, wherein
the pixels include a third pixel adjacent to the first pixel along the column direction,
the third pixel includes:
   a third photoelectric conversion layer that converts incident light to generate charge, and
   a third pixel electrode that collects the charge generated by the third photoelectric conversion layer, and
the imaging device further comprises a second shield via that extends from the shield electrode and that is located between the first pixel electrode and the third pixel electrode in the plan view.

3. The imaging device according to claim 2, wherein
the pixels include a fourth pixel adjacent to the second pixel along the column direction,
the fourth pixel includes:
   a fourth photoelectric conversion layer that converts incident light to generate charge, and
   a fourth pixel electrode that collects the charge generated by the fourth photoelectric conversion layer, and
the imaging device further comprises a third shield via that extends from the shield electrode and that is located between the first pixel electrode and the fourth pixel electrode in the plan view.

4. The imaging device according to claim 1, further comprising:
a fourth shield via, wherein
the shield electrode surrounds the pixels in a shape of a lattice, and
in the plan view, the fourth shield via extends from a vertex of the lattice of the shield electrode.

5. The imaging device according to claim 1, further comprising:
a first wiring layer,
wherein the first shield via extends from the shield electrode to the first wiring layer.

6. The imaging device according to claim 1, further comprising:
an insulating portion located between the shield electrode and the first photoelectric conversion layer and located between the shield electrode and the second photoelectric conversion layer.

7. The imaging device according to claim 6,
wherein, in the plan view, the insulating portion includes a portion that does not overlap the shield electrode.

8. The imaging device according to claim 7,
wherein, in the plan view, the insulating portion is spaced from the first pixel electrode.

9. The imaging device according to claim 6, wherein
the insulating portion has a film shape, and
a thickness of the film shape is greater than or equal to 10 nm.

10. The imaging device according to claim 1,
wherein a surface of the first pixel electrode and a surface of the shield electrode are in a same plane.

11. The imaging device according to claim 1, further comprising:
a fifth shield via, wherein
the shield electrode surrounds the pixels in a shape of a lattice, and
the first shield via and the fifth shield via extend from one side of the lattice of the shield electrode.

12. The imaging device according to claim 1,
wherein a spacing width between the first pixel electrode and the shield electrode is greater than or equal to 0.1 μm and is less than or equal to 1 μm.

13. An imaging device comprising:
pixels that are disposed in a row direction and a column direction and that include a first pixel;
a shield electrode that surrounds the pixels in a shape of a lattice; and
a first shield via that extends from the shield electrode, wherein
the first pixel includes:
   a first photoelectric conversion layer that converts incident light to generate charge,
   a first pixel electrode that collects the charge generated by the first photoelectric conversion layer, and
   an insulating portion located between an upper surface of the shield electrode and a lower surface of the first photoelectric conversion layer.

14. The imaging device according to claim 13,
wherein, in a plan view, the insulating portion is spaced from the first pixel electrode.

15. The imaging device according to claim 13, wherein
the insulating portion has a film shape, and
a thickness of the film shape is greater than or equal to 10 nm.

16. The imaging device according to claim 13, further comprising:
an amplifying transistor that includes a gate electrode electrically connected to the first pixel electrode.

17. The imaging device according to claim 13,
wherein, in a plan view, the insulating portion includes a portion that does not overlap the shield electrode.

18. The imaging device according to claim 13,
wherein a lower surface of the insulating portion and a side surface of the insulating portion form an angle that is less than 90 degrees.

19. The imaging device according to claim 13,
wherein a spacing width between the first pixel electrode and the shield electrode is greater than or equal to 0.1 μm and is less than or equal to 1 μm.

20. The imaging device according to claim 13,
wherein, in a plan view, an area of the first pixel electrode is greater than an area of the shield electrode.

21. An imaging device comprising:
pixels that are disposed in a row direction and a column direction and that include a first pixel and a second pixel adjacent to the first pixel along the row direction;
a shield electrode located between the first pixel and the second pixel; and
a first shield via that extends from the shield electrode, wherein
the first pixel includes:
  a first photoelectric conversion layer that converts incident light to generate charge,
  a first pixel electrode that collects the charge generated by the first photoelectric conversion layer, and
  a first pixel via that extends from the first pixel electrode,
the second pixel includes:
  a second photoelectric conversion layer that converts incident light to generate charge,
  a second pixel electrode that collects the charge generated by the second photoelectric conversion layer, and
  a second pixel via that extends from the second pixel electrode,
the shield electrode is electrically isolated from the first pixel electrode and the second pixel electrode,
the first shield via is located between the first pixel electrode and the second pixel electrode in a plan view, and,
in the plan view, the first pixel via is symmetrically located with the second pixel via with respect to the first shield via.

22. An imaging device comprising:
pixels that are disposed in a row direction and a column direction and that include a first pixel and a second pixel adjacent to the first pixel along the row direction; and
a shield electrode located between the first pixel and the second pixel, wherein
the first pixel includes:
  a first photoelectric conversion layer that converts incident light to generate charge,
  a first pixel electrode that collects the charge generated by the first photoelectric conversion layer, and
  an insulating portion located between the shield electrode and the first photoelectric conversion layer, and
a lower surface of the insulating portion and a side surface of the insulating portion form an interior angle that is less than 90 degrees.

23. An imaging device comprising:
pixels that are disposed in a row direction and a column direction and that include a first pixel and a second pixel adjacent to the first pixel along the row direction;
a shield electrode located between the first pixel and the second pixel;
a first shield via that extends from the shield electrode; and
a second shield via that extends from the shield electrode, wherein
the first pixel includes:
  a first photoelectric conversion layer that converts incident light to generate charge,
  a first pixel electrode that collects the charge generated by the first photoelectric conversion layer, and
  a first pixel via that extends from the first pixel electrode,
the second pixel includes:
  a second photoelectric conversion layer that converts incident light to generate charge, and
  a second pixel electrode that collects the charge generated by the second photoelectric conversion layer,
the shield electrode is electrically isolated from the first pixel electrode and the second pixel electrode,
the first shield via is located between the first pixel electrode and the second pixel electrode in a plan view, and
the second shield via is symmetrically located with the first shield via with respect to the first pixel via.

* * * * *